(12) United States Patent
Katayama et al.

(10) Patent No.: US 8,040,088 B2
(45) Date of Patent: Oct. 18, 2011

(54) POWER INVERTER

(75) Inventors: Hiroshi Katayama, Kumamoto (JP);
Koichi Yahata, Hitachinaka (JP);
Masashige Tsuji, Hitachinaka (JP);
Takashi Fujimoto, Hitachinaka (JP);
Hiroaki Igarashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 313 days.

(21) Appl. No.: 12/479,881

(22) Filed: Jun. 8, 2009

(65) Prior Publication Data
US 2009/0243524 A1    Oct. 1, 2009

Related U.S. Application Data

(63) Continuation of application No. 11/783,057, filed on Apr. 5, 2007, now Pat. No. 7,561,448.

(30) Foreign Application Priority Data

Apr. 6, 2006   (JP) .................................. 2006-104920

(51) Int. Cl.
*H02P 6/16* (2006.01)
(52) U.S. Cl. ......... 318/400.07; 318/400.17; 318/400.26; 318/505
(58) Field of Classification Search ............. 318/400.07, 318/400.3, 400.31, 400.26, 400, 17, 722, 318/505, 506, 507; 180/54.1, 60, 297, 65.1, 180/65.21, 65.285, 65.31, 65.51, 65.8; 363/120, 363/123, 131, 132, 141, 146, 147
See application file for complete search history.

(56) References Cited

U.S. PATENT DOCUMENTS

| 4,748,386 | A | | 5/1988 | Nakanishi et al. |
| 5,619,107 | A | * | 4/1997 | Shinohara et al. ............ 318/139 |
| 5,804,973 | A | | 9/1998 | Shinohara et al. |
| 5,808,376 | A | | 9/1998 | Gordon et al. |
| 6,137,203 | A | | 10/2000 | Jermakian et al. |
| 6,313,598 | B1 | * | 11/2001 | Tamba et al. ................. 318/722 |
| 6,850,426 | B2 | | 2/2005 | Kojori et al. |
| 6,940,715 | B2 | * | 9/2005 | Beihoff et al. ................ 361/689 |
| 7,187,568 | B2 | * | 3/2007 | Radosevich et al. .......... 363/144 |
| 7,317,290 | B2 | * | 1/2008 | Gandrud et al. .............. 318/105 |
| 7,358,694 | B2 | | 4/2008 | Won et al. |

(Continued)

FOREIGN PATENT DOCUMENTS

DE   103 41 512 A1    4/2005

(Continued)

OTHER PUBLICATIONS

Japanese Office Action dated Mar. 15, 2011 (Two (2) pages).

*Primary Examiner* — Walter Benson
*Assistant Examiner* — Thai Dinh
(74) *Attorney, Agent, or Firm* — Crowell & Moring LLP

(57) ABSTRACT

A power inverter comprises a power module connected at least to a rotating electric machine, a gate drive circuit board which supplies switching power to the power module, and a rotating electric machine control circuit board which supplies a signal for controlling the waveform of the switching power to the gate drive circuit board. A noise reduction board is formed on a board different from the rotating electric machine control circuit board. The configuration of the noise reduction board is such that various signals for forming a signal for controlling the waveform of the switching power by means of the rotating electric machine control circuit board are inputted through the noise reduction board to the rotating electric machine control circuit board.

12 Claims, 16 Drawing Sheets

U.S. PATENT DOCUMENTS 7,830,689 B2 * 11/2010 Nakamura et al. ............ 363/141
2003/0133318 A1 7/2003 Radosevich et al.

FOREIGN PATENT DOCUMENTS

| | | | |
|---|---|---|---|
| JP | 9-51605 | A | 2/1997 |
| JP | 2000-78851 | A | 3/2000 |
| JP | 2002-204580 | A | 7/2002 |
| JP | 2003-199363 | A | 7/2003 |
| JP | 2004-104860 | A | 4/2004 |

* cited by examiner

POWER INVERTER

CROSS REFERENCE TO RELATED APPLICATION

This application is a continuing application of U.S. application Ser. No. 11/783,057, filed Apr. 5, 2007, which claims priority under 35 U.S.C. §119 to Japanese Patent Application No. 2006-104920, filed Apr. 6, 2006, the entire disclosure of which are herein expressly incorporated by reference.

BACKGROUND OF THE INVENTION

1. Field of the Invention

The present invention relates to a power inverter, for example, a power inverter suitable for vehicles.

2. Description of the Related Art

A power inverter comprises an inverter, a smoothing capacitor connected in parallel with DC power supply terminals of the inverter, and a control circuit which controls the inverter. The inverter is configured of a plurality of power semiconductors, and the plurality of inverters are used as a power module in unit of a predetermined number. Therefore, the inverter comprises one or a plurality of power modules including a plurality of power semiconductors.

It is known that such a power inverter configured as a unit comprises a chassis which mounts the power module, a second block which mounts the smoothing capacitor, and a third block which mounts a control board integrating the control circuit, which are all stacked in order, wherein the second block is fixed to the chassis and the third block is fixed to the second block.

A power inverter having such a configuration is disclosed in detail, for example, in JP-A-2003-199363.

SUMMARY OF THE INVENTION

However, in a power inverter having such a configuration, the control board fixed to the third block mounts a microcomputer, etc., and is provided with a function to appropriately form a signal for controlling the waveform of switching power supplied to the inverter, for example, corresponding to each individual operation mode of the vehicle.

Therefore, the control board is configured as a board having a relatively large area because a circuit mounted thereon is complicated. And at least the planar size of the power inverter is determined by the size of the control board.

This has created a demand for the control board having a smaller area to downsize the power inverter.

An object of the present invention is to provide a power inverter which can be downsized.

A main object of the present invention is to provide a power inverter which prevents an increase in size.

A main invention disclosed in the present application is provided with at least one of the following features. Then, the features will be explained briefly.

(1) A feature of the present invention is a power module connected at least to a rotating electric machine, a gate drive circuit board which supplies switching power to the power module, and a rotating electric machine control circuit board which supplies a signal for controlling the waveform of the switching power to the gate drive circuit board, wherein a noise reduction board is formed on a board different from the rotating electric machine control circuit board; and the configuration of the noise reduction board is such that various signals for forming a signal for controlling the waveform of the switching power by means of the rotating electric machine control circuit board are inputted through the noise reduction board to the rotating electric machine control circuit board.

(2) Another feature of the present invention is a power module connected to a rotating electric machine, a gate drive circuit board which supplies switching power to the power module, a rotating electric machine control circuit board which supplies a signal for controlling the waveform of the switching power to the gate drive circuit board, and a smoothing capacitor connected in parallel to a position where the power module and a battery are connected, wherein an active discharge board is formed on a board different from the rotating electric machine control circuit board, and the active discharge board is configured so that the smoothing capacitor be forcibly discharged by the signal inputted thereto.

(3) Still another feature of the present invention is a power module connected to a rotating electric machine, a gate drive circuit board which supplies switching power to the power module, a rotating electric machine control circuit board which supplies a signal for controlling the waveform of the switching power to the gate drive circuit board, and a smoothing capacitor connected in parallel to a position where the power module and a battery are connected, wherein a noise reduction board is formed on a board different from the rotating electric machine control circuit board, and the configuration of the noise reduction board is such that various signals for forming a signal for controlling the waveform of the switching power by means of the rotating electric machine control circuit board are inputted through the noise reduction board to the rotating electric machine control circuit board; and an active discharge board is formed on a board different from the rotating electric machine control circuit board, and the active discharge board is configured so that the smoothing capacitor be forcibly discharged by the signal inputted thereto.

(4) Still another feature of the present invention is the signal inputted to the active discharge board through the noise reduction board on the assumption of the configuration in (3).

(5) Other features of the present invention will be further explained in the following embodiments.

An effect of the present invention is that a power inverter can be downsized.

DETAILED DESCRIPTION OF THE PREFERRED EMBODIMENTS

The following explains embodiments of the power inverter by the present invention with reference to the accompanying drawings.
(Electric Vehicle 100)

Figure 1:
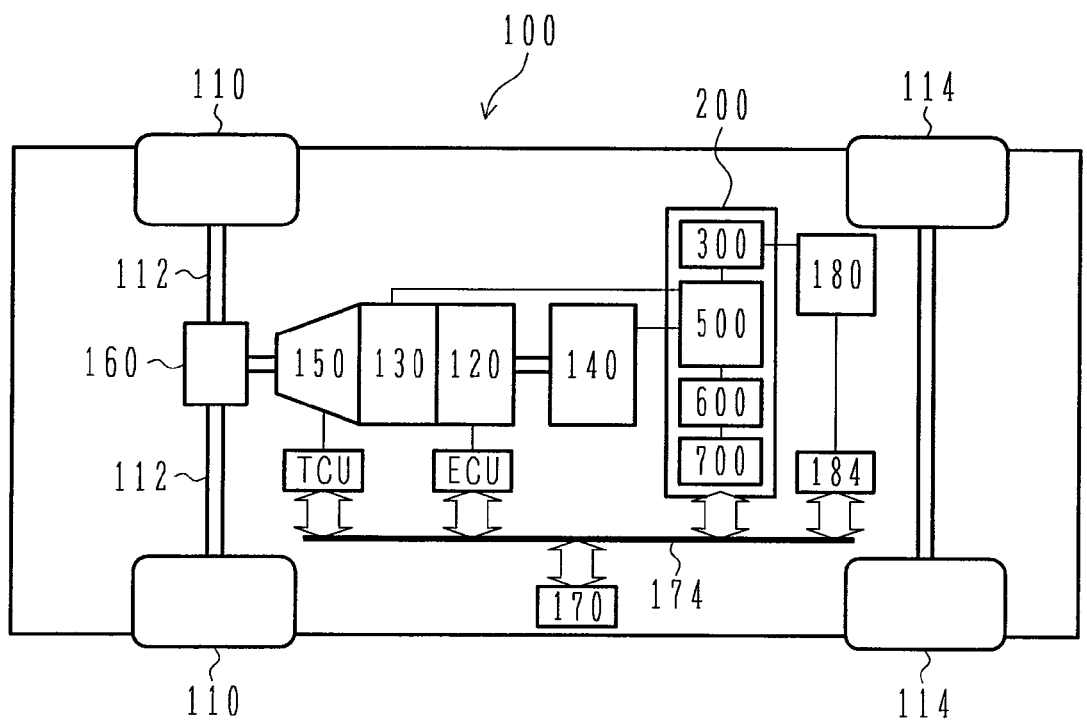
FIG. 1 is a system diagram showing a hybrid electric vehicle which can mount the power inverter according to an embodiment of the present invention.

FIG. 1 is a schematic diagram showing a hybrid electric vehicle which can mount the power inverter according to an embodiment of the present invention. A power inverter 200 according to the present invention can obviously be applied also to a pure electric vehicle, and many of basic configurations and operations are common to a hybrid electric vehicle and a pure electric vehicle. Therefore, the following explains some embodiments of hybrid electric vehicle as a representative case.

A hybrid electric vehicle 100 having front wheels 110 and rear wheels 114 is provided with an engine 120, a first rotating electric machine 130, a second rotating electric machine 140, and a battery 180 which supplies high-voltage DC power to the first rotating electric machine 130 and second rotating electric machine 140. Actually, a battery for supplying low-voltage power (14V power) is further mounted to supply the power to later-mentioned control circuits. However, the battery is not shown. The rotational torque based on the engine 120, the first rotating electric machine 130, and the second rotating electric machine 140 is transmitted to a transmission control unit 154 and a differential gear 160; and transmitted to the front wheels 110 through axles 112.

A transmission control unit 154 which controls the transmission 150, an engine control unit 124 which controls the engine 120, the rotating electric machine control circuit of the rotating electric machine control circuit board 700 which controls the power inverter 200, and a battery control unit 184 which controls the battery 180 are connected to a vehicle control unit 170 through a local area network 174 which is a signal circuit 174.

The vehicle control unit 170 receives information indicating each status from the transmission control unit 154, the engine control unit 124, the power inverter 200, and the battery control unit 184, which are all subordinate control units, through the signal circuit 174. The information is used for integrated control of the vehicle from the viewpoint of the operability and safety of the vehicle. Integrated control of the vehicle is attained through cooperative operation of each of the control units. Control instructions for each control unit for realizing integrated control of the vehicle are transmitted to each control unit from the vehicle control unit 170 through the signal circuit 174. For example, the battery control unit 184 reports the discharge status of the battery 180 and the condition of each cell battery constituting the battery to the vehicle control unit 170. If the vehicle control unit 170 determines that the battery 180 needs to be charged based on the above-mentioned report, the unit issues an instruction for power generation to the power inverter 200. The vehicle control unit 170 manages the output torque of the engine 120, and the first rotating electric machine 130 and the second rotating electric machine 140; obtains the total torque or torque distribution ratio of the output torque of the engine and the first rotating electric machine 130 and second rotating electric machine 140 through operational processing; and transmits control instructions based on processing results to the transmission control unit 154, the engine control unit 124, and the power inverter 200. The power inverter 200 controls the first rotating electric machine 130 and the second rotating electric machine 140 based on the torque instructions, and controls these rotating electric machines so that the instructed torque power be generated by either or both rotating electric machines.

The first rotating electric machine 130 and the second rotating electric machine 140 are structured so as to operate as a motor or a dynamo. For example, when the first rotating electric machine 130 is operating as a motor, the second rotating electric machine 140 can be operated as a motor or a dynamo. As mentioned above, the vehicle control unit 170 determines the distribution of the output torque of the engine and the output torque of the rotating electric machine as respective target torque through operational processing based on the operating condition of the vehicle; and transmits them to the power inverter 200 through the signal circuit 174 using the target torque of the rotating electric machine as a torque instruction. Based on the instructions, the power inverter 200 determines through operational processing whether each of the first rotating electric machine 130 and the second rotating electric machine 140 is to be operated as a motor or a dynamo, and controls the first rotating electric machine 130 and the second rotating electric machine 140.

However, as another embodiment, it would be possible to determine whether the first rotating electric machine 130 and the second rotating electric machine 140 are to be operated as a motor or a dynamo through operational processing by the vehicle control unit 170. With this method, the vehicle control unit 170 determines the torque to be generated in the case of motor operation of the first rotating electric machine 130 or the second rotating electric machine 140, or the power to be generated in the case of dynamo operation; and transmits the contents as an instruction to the power inverter 200 through the signal circuit 174.

Irrespective of the methods, the power inverter 200 controls switching operation of power semiconductors constituting inverters in order to operate the first rotating electric machine 130 and the second rotating electric machine 140 based on the instructions from the vehicle control unit 170. The first rotating electric machine 130 and the second rotating electric machine 140 are operated as a motor or a dynamo through switching operation of these power semiconductors. In the case of operation as a motor, the DC power from the high-voltage battery 180 is applied to the inverter of the power inverter 200, the DC power is converted to three-phase alternating current by controlling switching operation of the power semiconductors constituting inverters, the alternating current is supplied to the rotating electric machine 130 or 140, and the rotating electric machine 130 or 140 generates rotational torque as a motor. In the case of operation as a dynamo, on the other hand, the rotor of the rotating electric machine 130 or 140 is rotated by rotational torque from external, and three-phase AC power is generated in stator winding of the above-mentioned rotating electric machine based on this rotational torque. The generated three-phase AC power is converted to DC power by the power inverter 200, the DC power is supplied to the high-voltage battery 180, and the battery 180 is charged by the DC power.

It would be possible to mechanically connect the engine 120 directly with the first rotating electric machines 130 and the second rotating electric machine 140 shown in FIG. 1 through a rotating shaft. It would also be possible that these rotating electric machines are connected through gears or clutches. When the first rotating electric machine 130 and the second rotating electric machine 140 are directly connected with the engine 120, the first rotating electric machine 130 and the second rotating electric machine 140 rotate in direct proportion to the rotational speed of the engine. Therefore, the rotational speed of the first rotating electric machine 130 and the second rotating electric machine 140 varies over a wide range from a stop condition to high-speed rotating condition, making it necessary for the rotating electric machines to endure high-speed rotation and have a sufficient mechanical strength. Moreover, if the first rotating electric machine 130 and the second rotating electric machine 140 are constantly rotating, iron loss constantly occurs which becomes large particularly in high-speed rotations. On the other hand, this system has advantages of a simple structure and low cost.

Moreover, when the first rotating electric machine 130 and the second rotating electric machine 140 are connected with the drive mechanism of the vehicle through clutches or gears, there is an advantage that the fluctuation range of the rotational speed of the first rotating electric machine 130 and the second rotating electric machine 140 can be reduced. Moreover, the first rotating electric machine 130 and the second rotating electric machine 140 can be disconnected from the drive mechanism of the vehicle as required, which may prevent the operation efficiency from being reduced by iron loss of the rotating electric machines, etc. On the other hand, this system has a complicated structure resulting in high cost.

As shown in FIG. 1, the power inverter 200 comprises a capacitor module 300 having a plurality of smoothing capacitors for reducing voltage fluctuation of the DC power supply, a power module 500 including a plurality of power semiconductors, a board (hereafter referred to as gate drive circuit board) 600 including a gate drive circuit which controls switching operation of the power module 500; and a board (hereafter referred to as rotating electric machine control circuit board) 700 including a rotating electric machine control circuit which generates a signal for determining the time width of the above-mentioned switching operation, i.e., a PWM signal for controlling pulse-width modulation.

When the power module 500 is electrically connected, the power semiconductors included in the power module 500 are electrically connected to form an inverter circuit. A signal for controlling the power semiconductors constituting the above-mentioned inverter circuit is generated by the rotating electric machine control circuit board 700 and then sent to the gate drive circuit board 600. The gate drive circuit board 600, so-called a gate drive circuit for the power semiconductors, generate a gate drive signal to be supplied to the gate of each power semiconductor. The gate drive signal is sent to the gate of each power semiconductor. Each power semiconductor performs switching operation based on the gate drive signal.

For the capacitor module 300, the power module 500, the gate drive circuit board 600, and the rotating electric machine control circuit board 700, detailed circuits and operations will be explained later.

The high-voltage battery 180 is a rechargeable battery, such as a nickel hydride battery or a lithium ion battery, which outputs 300V, 600V, or other high-voltage DC power.

(Overall Configuration of Power Inverter)

Figure 2:
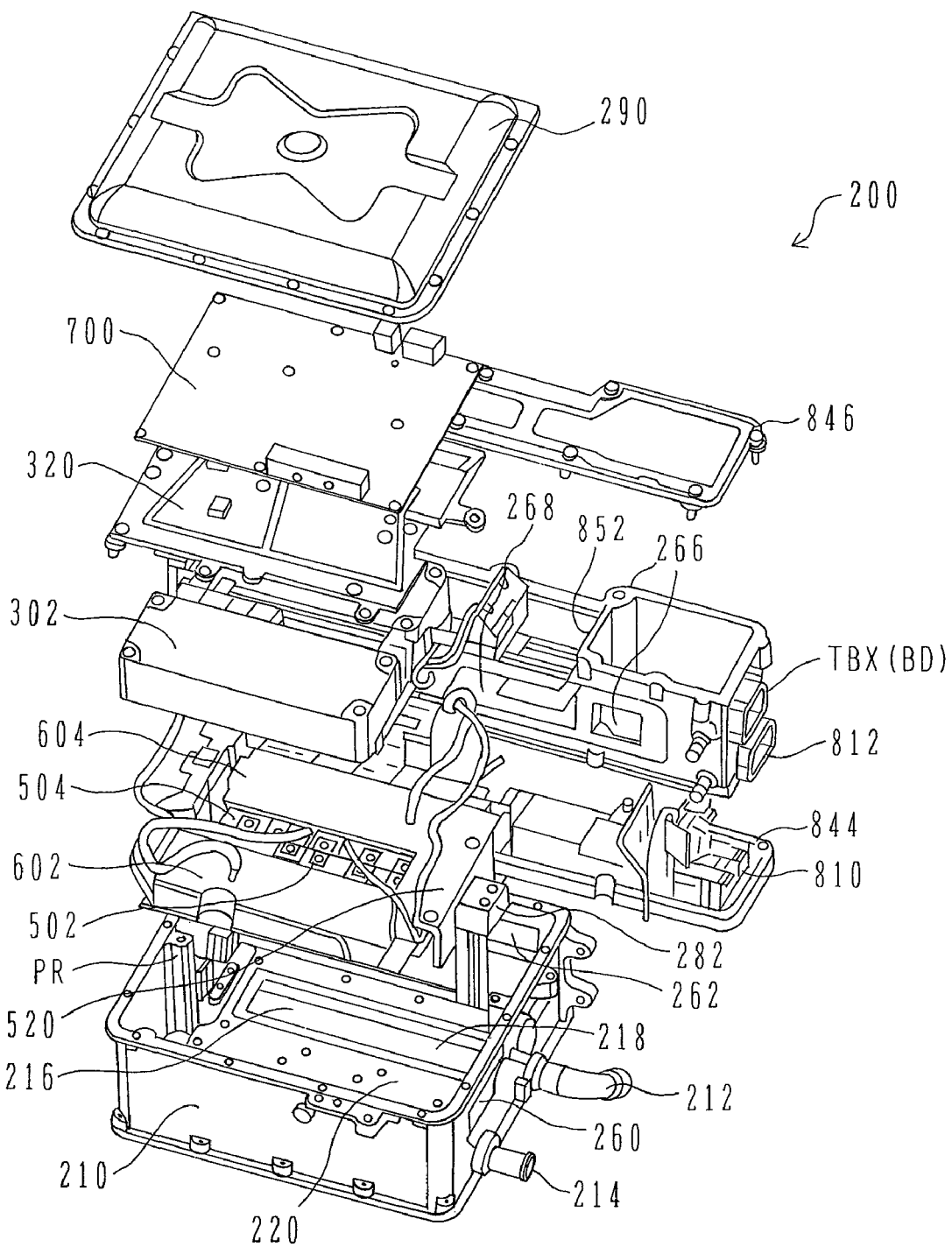
FIG. 2 is a disassembly perspective view showing the overall configuration of the power inverter according to the embodiment of the present invention.
Figure 3:
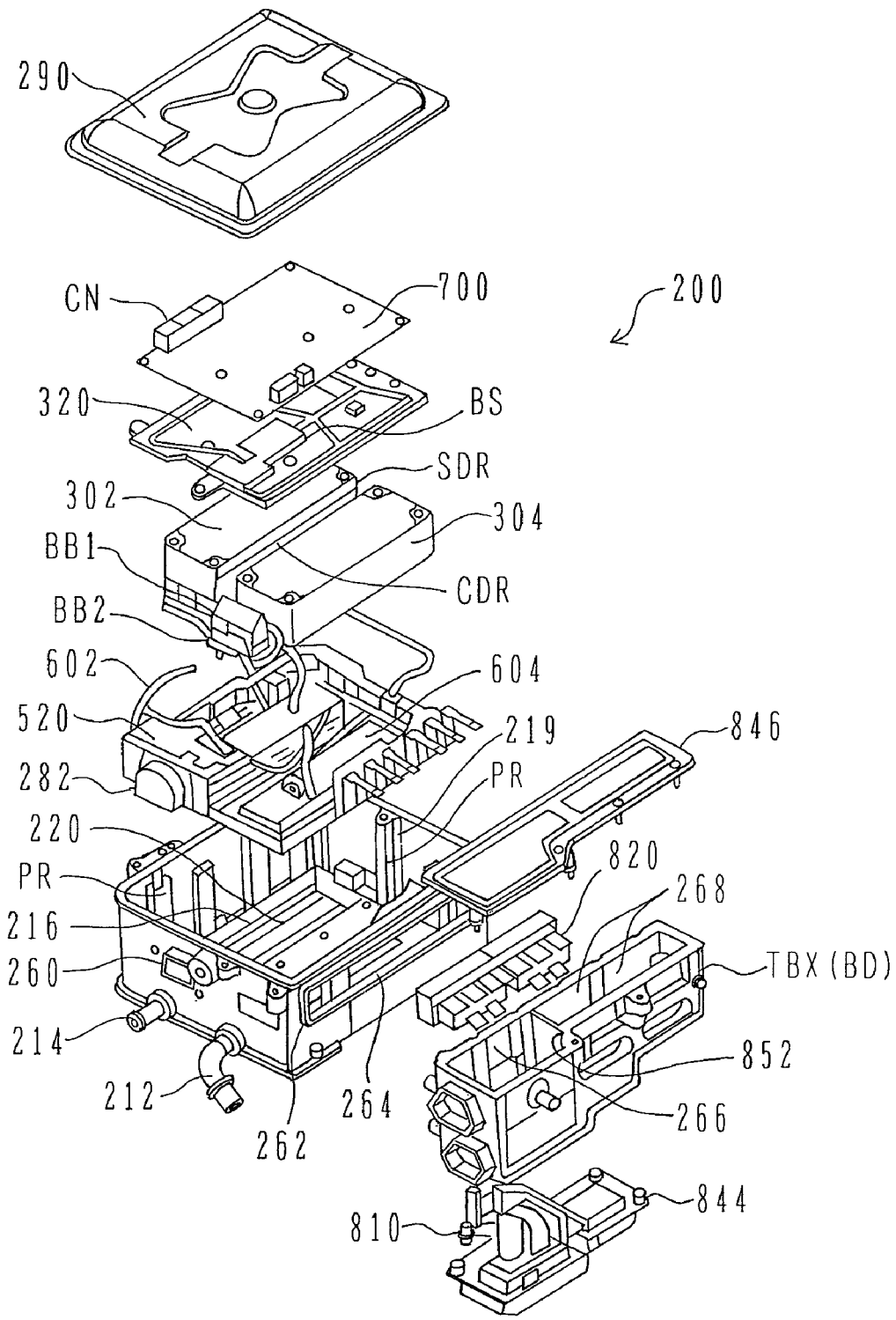
FIG. 3 is a disassembly perspective view showing the overall configuration of the power inverter according to the embodiment of the present invention, viewed from a different direction from FIG. 2.
Figure 4:
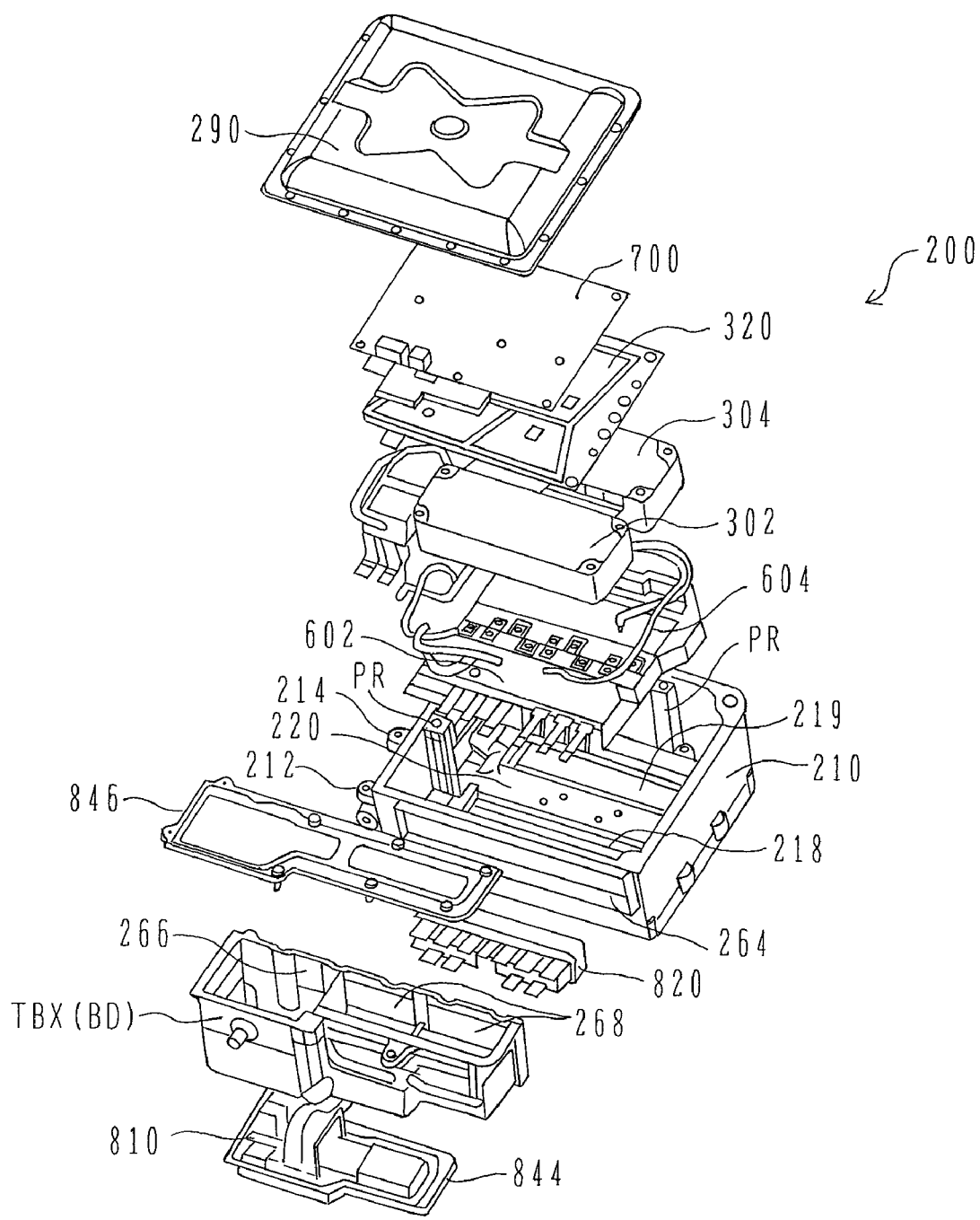
FIG. 4 is a disassembly perspective view showing the overall configuration of the power inverter according to the embodiment of the present invention, viewed from a different direction from FIG. 2 and FIG. 3.

FIG. 2, FIG. 3, and FIG. 4 are disassembly perspective views of the power inverter 200, schematically showing a configuration of the power inverter 200. FIG. 2, FIG. 3, and FIG. 4 are disassembly perspective views of the power inverter 200, viewed from different directions.

The power inverter 200 has a box-shaped chassis 210, and a coolant channel body 220 including a coolant channel 216 for coolant circulation is installed at the bottom of the chassis 210. A coolant inlet pipe 212 for supplying coolant to the coolant channel 216 and a coolant outlet pipe 214 are fixed to the bottom of the chassis 210 in such a way that the pipes project to the outside of the chassis 210.

The power module 500 explained with reference to FIG. 1 comprises a first power module 502 and a second power module 504 arranged side by side in the chassis 210. The first power module 502 and the second power module 504 are provided with cooling fins 506 and 507, respectively. On the other hand, the coolant channel body 220 is provided with openings 218 and 219 which connect to the channel. By fixing the first power module 502 and second power module 504 above the cooling channel 216, the cooling fins 506 and 507 project into a channel 216 from openings 218 and 219, respectively, prepared in the coolant channel body 220. The openings 218 and 219 are closed by a metal wall around cooling fins 506 and 507, respectively, to prevent leak of coolant and form a coolant channel. This first power module 502 and the second power module 504 are arranged on both sides of a virtual line perpendicularly intersecting with the sidewall surface on which the coolant inlet pipe 212 and the coolant outlet pipe 214 are formed. The coolant channel formed inside the coolant channel body 220 extends from the coolant inlet pipe 212 in a longitudinal direction of the chassis bottom to the other end. Then, the coolant channel is turned round in U-shape at the other end and extends again in a longitudinal direction of the chassis bottom to the outlet pipe 214. A pair of parallel channels in the above-mentioned longitudinal direction are formed in the coolant channel body 220, and the openings 218 and 219, through which respective channel penetrates, are formed in the coolant channel body 220. The first power module 502 and the second power module 504 are fixed to the coolant channel body 220 along the above-mentioned channel. Efficient cooling is accomplished by the cooling fins prepared in the first power module 502 and the second power module 504, which project into the channel. At the same time, an efficient cooling structure can be realized by the cooling surfaces of the first power module 502 and the second power module 504, which are firmly attached to the coolant channel body 220 made of metal. Furthermore, since the openings 218 and 219 are closed by the cooling surface of the first power module 502 and the second power module 504, respectively, the structure is downsized while improving the cooling performance.

A first drive circuit board 602 and a second drive circuit board 604 are arranged side by side, and are stacked on the power module 502 and second power module 504, respectively. The first drive circuit board 602 and second drive circuit board 604 constitute the gate drive circuit board 600 explained with reference to FIG. 1.

The first drive circuit board 602 arranged above the power module 502 is formed in a slightly smaller size than the first power module 502 from the two-dimensional standpoint. In FIG. 2, FIG. 3, and FIG. 4, only terminals arranged side by side on both sides of the first power module 502 are exposed and observed, and the most part of the power module 502 is hidden by the first drive circuit board 602. Likewise, the second drive circuit board 604 arranged above the power module 504 is formed in a slightly smaller size than the second power module 504 from the two-dimensional standpoint. In FIG. 2, FIG. 3, and FIG. 4, only terminals arranged side by side on both sides of the second power module 504 are exposed and observed, and the most part of the power module 504 is hidden by the second drive circuit board 604.

The coolant inlet pipe 212 and the coolant outlet pipe 214 are formed on a side face of the chassis 210, and an opening 260 is further formed on this side. A signal connector 282 is arranged at the opening 260. Inside the chassis 210 at the attachment position of the connector 282 arranged are a noise reduction board 560 and a second discharge board 520 which are fixed in close vicinity to the connector 282. The noise reduction board 560 and second discharge board 520 are fixed so that their attachment surface be in parallel with the attachment surface of the first power module 502 and second power module 504.

The noise reduction board 560 is arranged below the second discharge board 520 in stacked manner and therefore hidden by the second discharge board 520, for example, in FIG. 2, FIG. 3, and FIG. 4. The noise reduction board 560 and second discharge board 520 are sufficiently spaced from the power module 500 and the gate drive circuit board 600 including a gate drive circuit in the height direction of the chassis 210. The gate drive circuit board 600 comprises a plurality of boards: the first drive circuit board 602 and the second drive circuit board 604.

The capacitor module 300 having a plurality of smoothing capacitors is arranged above the plurality of drive circuit boards 602 and 604. The capacitor module 300 actually includes a first capacitor module 302 and a second capacitor module 304 arranged above the first drive circuit board 602 and the second drive circuit board 604, respectively. The first capacitor module 302 and the second capacitor module 304 are fixed to the base plate 320, and the electrodes are configured so as to be connected with the power module 500.

The flat base plate 320 is fixed above the first capacitor module 302 and the second capacitor module 304 in such a way that its fringes are firmly attached to the inner wall surfaces of the chassis 210. The base plate 320 supports and fixes the first capacitor module 302 and second capacitor module 304 on the side of the above-mentioned first and second power modules, and the rotating electric machine control circuit board 700 on the opposite side. And this base plate 320 made of a metal material, like the chassis 210 for example, is configured so that heat generated in the first capacitor module 302 and second capacitor module 304, and the rotating electric machine control circuit board 700 goes into the chassis 210 for cooling.

As mentioned above, the power module 500, the gate drive circuit board 600, the noise reduction board 560, the second discharge board 520, the capacitor module 300, the base plate 320, and the rotating electric machine control circuit board 700 are stored in the chassis 210; and the opening at the top of the chassis 210 is closed by a metal cover 290.

Moreover, when the sidewall of the chassis 210 on which the coolant inlet pipe 212 and coolant outlet pipe 214 are installed is positioned as the front side, a terminal box 800 is attached, for example, on the right-hand sidewall of the chassis. The terminal box 800 includes DC power terminals 812 for supplying DC power from the battery 180 and DC power terminal blocks 810 prepared therein, and AC power terminals 822 for connecting the first rotating electric machine 130 and the second rotating electric machine 140 and AC terminal blocks 820 prepared therein.

The DC power terminal blocks 810 are electrically connected through busbars to the electrodes of the first capacitor module 302 and second capacitor module 304, and the AC terminal blocks 820 are electrically connected through busbars to the AC output terminals of the plurality of power modules 502 and 504 constituting the power module 500.

The configuration of the terminal box 800 is such that a bottom plate 844 arranging the DC power terminal blocks 810 and a cover 846 are attached to a main part 840 to make it easier to assemble the terminal box 800.

Figure 5:
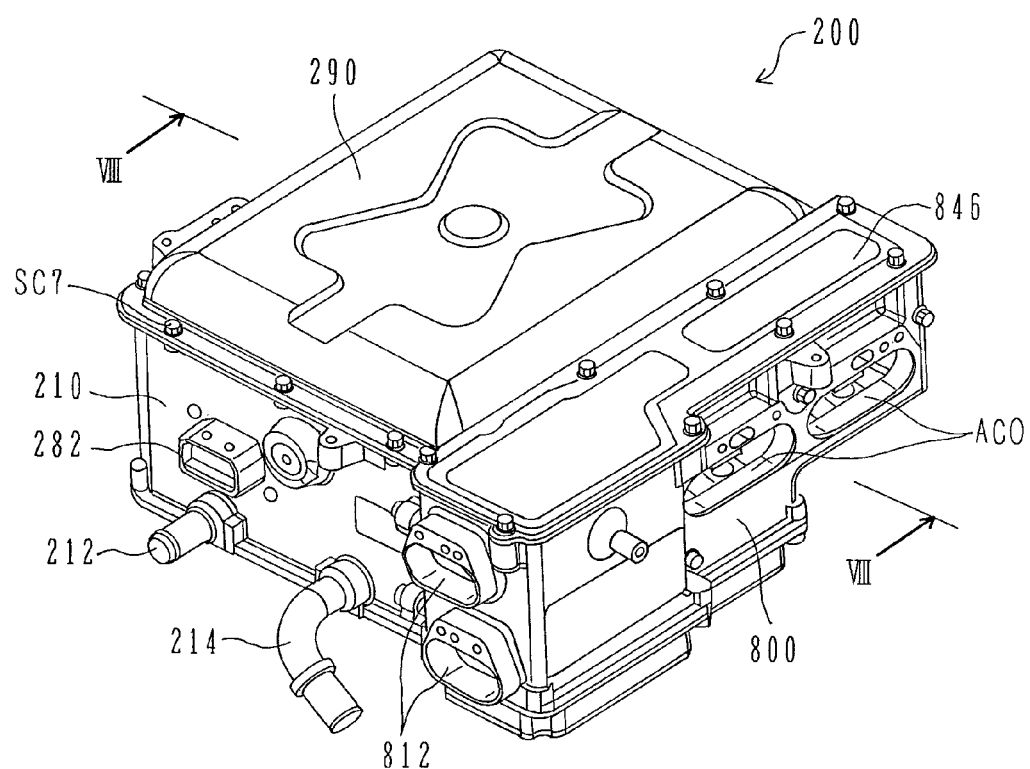
FIG. 5 is an appearance perspective view showing the power inverter according to the embodiment of the present invention.

The thus-assembled power inverter 200 is configured in a very compact shape, as shown in the external view in FIG. 5.

Each of the DC power terminal blocks 810, DC power terminals 812, AC terminal blocks 820, and AC power terminals 822 functions as an AC output terminal, an AC terminal block, a DC input terminal, and a DC terminal block, respectively, based on a hybrid vehicle operation mode in which, for example, the first rotating electric machine 130 is operated as a dynamo, the three-phase AC power (regenerative energy) obtained is converted to DC power by the power inverter 200, and the DC power is supplied to the battery 180.

Electrical Circuit Diagram of Power Inverter

Figure 6:
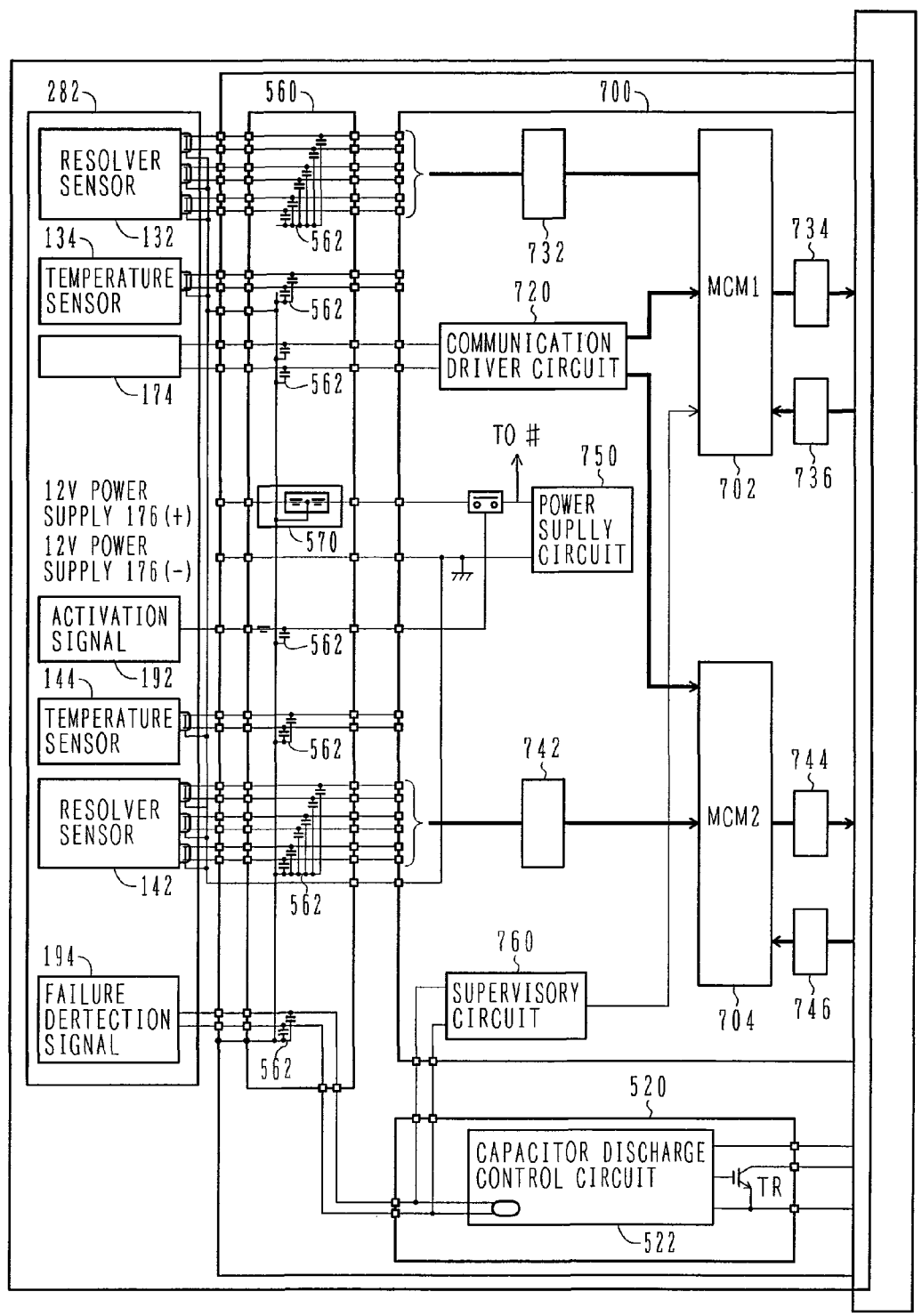
FIG. 6 is a left-half partial circuit diagram showing circuit boards to be mounted on the power inverter and connections between these circuit boards, according to the embodiment of the present invention, which forms a complete diagram when combined with FIG. 7.
Figure 7:
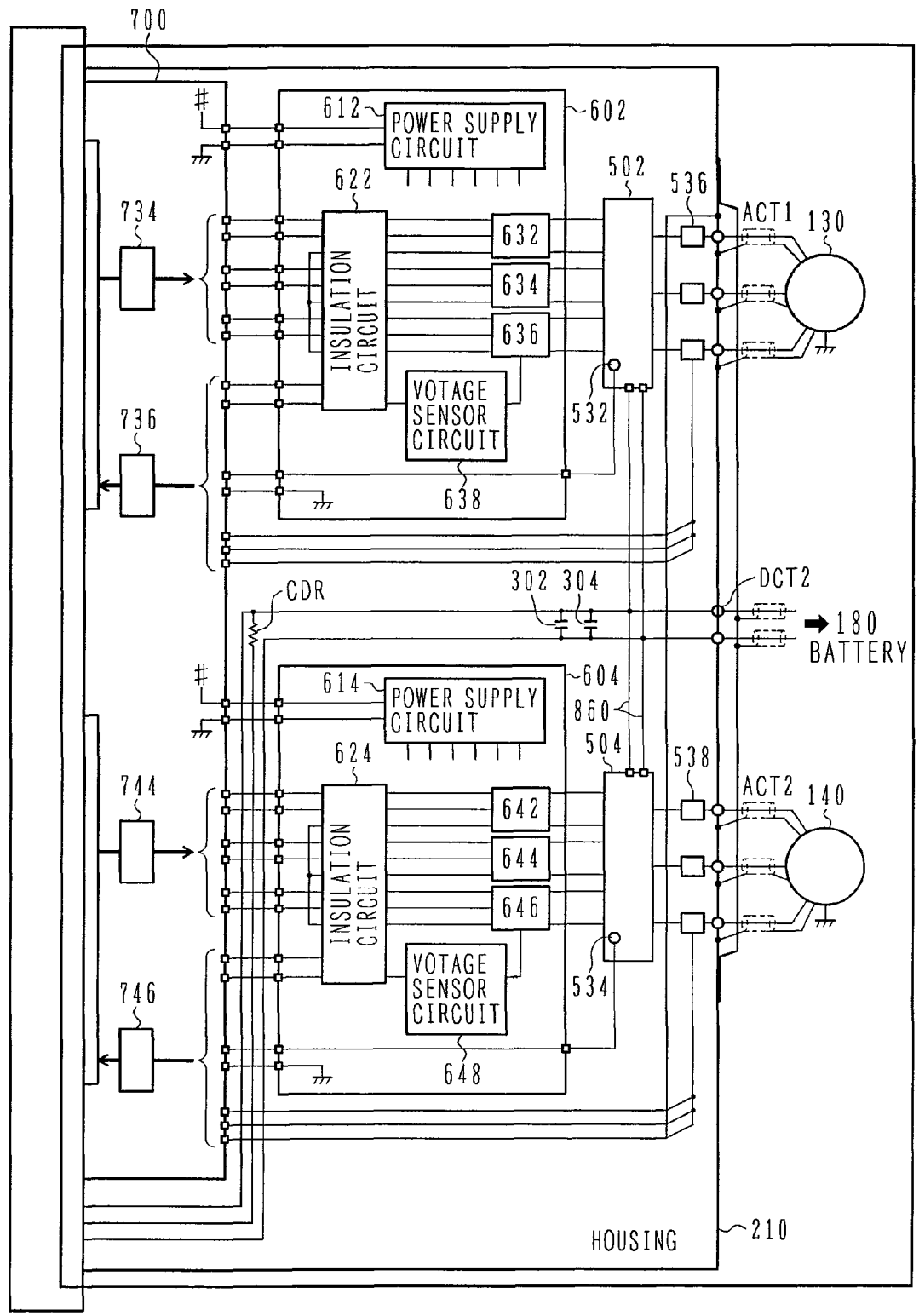
FIG. 7 is a right-half partial circuit diagram showing circuit boards to be mounted on the power inverter and connections between these circuit boards connections between these circuit boards and, which forms a complete diagram when combined with FIG. 6.

Prior to detailed explanations of each of the above-mentioned components of the power inverter 200, circuit configurations and connection forms of the power module 500, the gate drive circuit board 600, the noise reduction board 560, the second discharge board 520, and the rotating electric machine control circuit board 700 will be explained together with other parts, with reference to FIG. 6 and FIG. 7. FIG. 6 and FIG. 7 are respectively left-half and right-half partial diagrams. Combining FIG. 6 and FIG. 7 forms a complete circuit diagram.

(Noise Reduction Board 560)

First, each signal inputted to or outputted from the power inverter 200 through the signal connector 282 passes the noise reduction board 560. These signals include signals from a resolver sensor 132 of the rotor built in the first rotating electric machine 130, a signal from a temperature sensor 134 built in the first rotating electric machine 130, signals sent to and received from a vehicle control unit 170 and other control units through the signal circuit 174, an activation signal 192 sent from the vehicle control unit 170, a signal from a resolver sensor 142 of the rotor built in the second rotating electric machine 140, a signal from a temperature sensor 144 built in the second rotating electric machine 140, and a failure detection signal 194 sent from the vehicle control unit 170. Signals sent through the signal circuit 174 include a signal of engine rotational speed and a signal of accelerator opening.

Furthermore, a low-voltage current sent from the low-voltage battery is also configured to pass the noise reduction board 560. A positive electrode power from a 12V power supply 176 is outputted through an electrode, a filter circuit 570, and then an electrode, from one side to the other side of the noise reduction board 560. A negative electrode power from the 12V power supply 176 is outputted through an electrode, a distribution layer, and an electrode.

Each of the above-mentioned signals other than the 12V power supply 176 is outputted through an electrode, a bypass capacitor 562, and then an electrode, from one side to the other side of the noise reduction board 560. The bypass capacitor 562 is configured between a distribution layer in which each signal is transmitted and a distribution layer in which the negative electrode power from the 12V power supply is supplied.

The noise reduction board 560 having such a configuration reduces noise superimposed on each of the above-mentioned signals by means of the bypass capacitor 162 and supplies the signals to the rotating electric machine control circuit board 700 mentioned later.

The noise reduction board 560 is formed on a board different from the rotating electric machine control circuit board 700, physically spaced from the rotating electric machine control circuit board 700. This allows the noise reduction board 560 to be arranged at a desired position without being restrained by the attachment position of the rotating electric machine control circuit board 700.

Physically separating a circuit (equivalent to a circuit on the noise reduction board 560 in the present embodiment) which remove noise in an input signal from the rotating electric machine control circuit board 700 having a comparatively large area is effective for downsizing the rotating electric machine control circuit board 700. Furthermore, the noise reduction board 560 can be arranged in a desired manner, for example, it can be positioned in a plane in parallel with or perpendicular to the rotating electric machine control circuit board 700, which is therefore very convenient for downsizing the power inverter 200.

(Rotating Electric Machinery Control Circuit Board 700)

Each signal from the resolver sensor 132 and the temperature sensor 134 of the above-mentioned rotor inputted through the noise reduction board 560 is to be fed to a first microcomputer 702 through an interface circuit 732 on the rotating electric machine control circuit board 700.

Likewise, each signal from the resolver sensor 142 and the temperature sensor 144 of the rotor inputted through the noise reduction board 560 is to be fed to a second microcomputer 704 through an interface circuit 742 on the rotating electric machine control circuit board 700.

Information from the communication circuit 174 is sent to the first microcomputer 702 and second microcomputer 704 through the communication driver circuit 720. Moreover, information on the operating condition is sent from the first microcomputer 702 and second microcomputer 704 to the signal circuit 174 through the communication driver circuit 720 and the noise reduction board 560 to predetermined equipment, for example, the vehicle control unit 170. The vehicle control unit 170 determines each of operation modes of the vehicle, including the start, low-speed running, normal running (medium- and high-speed running), acceleration, deceleration, and braking modes. When the vehicle control unit 170 determines the operation mode, it transmits a judgment result to the first microcomputer 702 and the second microcomputer 704, and then the first microcomputer 702 and the second microcomputer 704 control the first rotating electric machine 130 and the second rotating electric machine 140, respectively, based on the result.

Control corresponding to the operation mode is such that, for example, mainly the first rotating electric machine 130 is operated as a motor in the start or low-speed running mode of the vehicle. In the normal running mode of the vehicle, the engine 120 and the first rotating electric machine 130 are used together to run the vehicle with torque of both. In the rapid acceleration or high-load operation mode of the vehicle, the operation in the above-mentioned normal running mode is performed, and the output power from the battery 180 is converted to three-phase AC power which is then supplied to the second rotating electric machine 140. The two rotating electric machines are operated as a motor, the output torque is used to drive the vehicle, and the output of the engine is further added to run the vehicle. In the deceleration or braking mode of the vehicle, the first rotating electric machine 130 and the second rotating electric machine 140 are operated as a dynamo, the obtained three-phase AC power is converted to DC power by a later-mentioned inverter, and the DC power is supplied to the battery 180 to charge it.

Upon reception of operation mode information from the vehicle control unit 170, each of the first microcomputer 702 and the second microcomputer 704 calculates operation timing of the power semiconductors constituting inverters through operational processing. A timing signal based on operation result of the first microcomputer 702 is sent to the first drive circuit board 602 through an interface circuit 734. Moreover, a timing signal calculated and generated by the second microcomputer 704 is sent to the second drive circuit board 604 through an interface circuit 744.

The output of a first current sensor 536 which detects a current value flowing in each phase of the stator winding of the first rotating electric machine 130, and the output of a first temperature sensor 532 built in the first power module 502 are captured in the first microcomputer 702 through an interface circuit 736. The first microcomputer 702 uses the captured output of the first current sensor 536 to perform operational processing of the operation timing of the above-mentioned power semiconductors for feedback control so that control based on a command value of the vehicle control unit 170 be performed. The output of the temperature sensor 532 is used to diagnose operation failures.

Likewise, the output of a second current sensor 538 which detects a current value flowing each phase of the stator winding of the second rotating electric machine 140, and the output of a second temperature sensor 534 built in the second power module 504 are captured in the second microcomputer 704 through an interface circuit 746. The second microcomputer 704 uses the captured output of the second current sensor 536 to perform operational processing of the operation timing of the above-mentioned power semiconductors for feedback control so that control based on a command value of the vehicle control unit 170 be performed. The output of the second temperature sensor 534 is used to diagnose operation failures.

The first current sensor 536 and the second current sensor 538 are installed on the AC output terminal blocks 820 mentioned later.

The rotating electric machine control circuit board 700 is provided with a supervisory circuit 760. A failure detection signal from the vehicle control unit 170, a superordinate control unit, obtained through the noise reduction board 560 and the second discharge board 520 is inputted to the supervisory circuit 760. The above-mentioned failure detection signal is generated if the vehicle control unit 170, a superordinate control unit, determines that there is a danger in a high-voltage portion. If the supervisory circuit 760 receives this signal, it sends an abnormal condition signal to the first microcomputer 702 as a result of monitoring. Based on this signal, the operation of the first rotating electric machine 130 is stopped by the first microcomputer 702. In this condition, the vehicle is operated with the output torque of the engine 120.

DC power is supplied from the 12V power supply 176 to a power supply circuit 750 through the noise reduction board 560, and a stabilized constant voltage is outputted from the power supply circuit 750. The output of the power supply circuit 750 is supplied to the first microcomputer 702, the second microcomputer 704, and the interface circuit 732 on the rotating electric machine control circuit board 700, and to other circuits on the rotating electric machine control circuit board 700.

(Gate Drive Circuit Board 600)

The gate drive circuit board 600 comprises the first drive circuit board 602 and the second drive circuit board 604. Switching timing signals generated by the first microcomputer 702 are inputted to the first drive circuit board 602 through the interface circuit 734 of the rotating electric machine control circuit board 700. These timing signals are inputted to a U-phase driver circuit 632, a V-phase driver circuit 634, and a W-phase driver circuit 636 through an insulation circuit 622 comprising, for example, a photo coupler. The output from each of these driver circuits 632, 634, and 636 is used as a drive signal for controlling switching operation of each power semiconductor in the first power module 502 mentioned later.

Moreover, the first drive circuit board 602 is provided with a voltage sensor circuit 638 which detects voltage in the driver circuits 632, 634, and 636. As mentioned above, the output of the voltage sensor circuit 638 is sent to the first microcomputer 702 through the insulation circuit 622 and the interface circuit 736 of the rotating electric machine control circuit board 700.

The driver circuits 632, 634, and 636 are driven by constant voltage from a power supply circuit 612 installed on the first drive circuit board 602. The 12V DC power from the signal connector 282 is supplied to the power supply circuit 612 through the noise reduction board 560 and the rotating electric machine control circuit board 700.

Switching timing signals generated by the second microcomputer 704 are inputted to the second drive circuit board 604 through the interface circuit 744 of the rotating electric machine control circuit board 700. These timing signals are inputted to a U-phase driver circuit 642, a V-phase driver circuit 644, and a W-phase driver circuit 646 through an insulation circuit 624. The output from each of these drivers 642, 644, and 646 is used as a signal for controlling switching operation of each power semiconductor in a second power module 504 mentioned later.

Like the first drive circuit board 602, the second drive circuit board 604 is provided with a voltage sensor circuit 648 which detects voltage of the driver circuits 642, 644, and 646. As mentioned above, the output is sent to the second microcomputer 704 through the insulation circuit 624 and the interface circuit 746 of the rotating electric machine control circuit board 700.

The circuit including the driver circuits 642, 644, and 646 is driven by stabilized power from a power supply circuit 614 mounted on the second drive circuit board 604. The 12V power PW from the signal connector 282 is supplied to the power supply circuit 614 through the noise reduction board 560 and the rotating electric machine control circuit board 700.

(Insulation Circuits 622 and 624)

In the present embodiment, two different DC power supplies are prepared: a low-voltage battery and a high-voltage battery 180. These power supplies are different not only in voltage but also in potential on the mutual ground side. Normal operation can be attained even with different ground potentials by preparing insulation circuits 622 and 624. For example, even if the potential of the driver circuits 632, 634 and 636, the voltage sensor circuit 638, the driver circuits 642, 644 and 646, and the voltage sensor circuit 648 is different from the ground potential of the rotating electric machine control circuit board, normal operation are attained by the insulation circuits 622 and 624 without being affected by the potential difference. This also applies to a capacitor discharge control circuit later mentioned in details.

(Power Module 500)

The power module 500 shown in FIG. 1 includes the first power module 502 and the second power module 504. Although not shown, the first power module 502 includes an inverter which includes a total of six power semiconductors, each two being connected in series constituting each of U-phase, V-phase, and W-phase bridge circuits. Both ends of each of the above-mentioned bridge circuits are configured so that the DC voltage from the battery 180 be supplied thereto. If the current supplied to the first rotating electric machine 130 is large current, the configuration is such that a plurality of power semiconductors constituting the above-mentioned inverter are arranged in parallel. The above-mentioned configuration also applies to the second power module 504.

Each power semiconductor of the U phase performs switching operation based on a signal from the driver circuit 632 of the gate drive circuit board 602; each power semiconductor of the V phase performs switching operation based on a signal from the driver circuit 634 of the gate drive circuit board 602; and each power semiconductor of the W phase performs switching operation based on a signal from the driver circuit 636 of the gate drive circuit board 602. Three-phase AC power is outputted and supplied to the first rotating electric machine 130. The current of each layer is detected by the current sensor 536.

A temperature sensor 532 is installed in the first power module 502, and a signal therefrom is captured by the first microcomputer 702 through the interface circuit 736. If temperature rises, the current to the first rotating electric machine is suppressed to prevent damage to the power module 502.

Likewise, the second power module 504 also includes an inverter comprising power semiconductors. Each phase power semiconductor constituting the inverter performs switching operation based on signals from driver circuits 642, 644, and 646 of the gate drive circuit board 614 to output three-phase alternating current or convert the output of the second rotating electric machine 140 to direct current. The current of each phase is detected by the current sensor 538. Moreover, the power module 504 includes a temperature sensor 534 and the output of the temperature sensor 534 is inputted to the second microcomputer 704 through the interface circuit 746. The control current of the inverter is suppressed according to temperature rise to prevent damage to the power module 504. Capacitor module 300, and first and second discharge resistors The capacitor module 300 in FIG. 1 includes the first capacitor module 302 and the second capacitor module 304 which are connected in parallel. The first capacitor module 302 and the second capacitor module 304 are connected in parallel between both lines of a busbar 860, which act as DC power lines, and high-voltage DC power is supplied from the DC high voltage battery 180 to the busbar 860. The busbar 860 is connected to both DC input terminals of the inverter circuit of each of the power module 502 and the second power module 504.

Moreover, a first discharge resistor (not shown) and a second discharge resistor 524 are connected in parallel with the first capacitor module 302 and second capacitor module 304. Each of these resistors is used to discharge electric charges accumulated in the first capacitor module 302 and the second capacitor module 304. The second discharge resistor 524 of these resistors is used to rapidly discharge electric charges accumulated in the first capacitor module 302 and the second capacitor module 304, which is performed through control by the second discharge board 520.

(Second Discharge Board 520)

A capacitor discharge control circuit 522 is provided on the second discharge board 520. This is because electric charges accumulated in the first capacitor module 302 and second capacitor module 304 are rapidly discharged by inputting a failure detection signal 194 from the signal connector 282 through the noise reduction board 560.

The capacitor discharge control circuit 522 is provided with a transistor, a switching element 526, which operates when the failure detection signal 194 is inputted. This transistor 526 is connected in series with the second discharge resistor 524. With the transistor 526, the second discharge resistor 524 forms a closed circuit with respect to the first capacitor module 302 and second capacitor module 304. With the conduction of the transistor 526, electric charges accumulated in the first capacitor module 302 and the second capacitor module 304 are discharged through the second discharge resistor 524.

High voltage, for example 300V or 600V, from the battery 180 is applied to the capacitor discharge control circuit 522. This high-voltage power differs from the ground potential of the noise reduction board 560 or the rotating electric machine control circuit board. For normal operation, the failure detection signal 194 is inputted to the capacitor discharge control circuit CDC through an insulation circuit 528 comprising, for example, a photo coupler. The second discharge board 520 is formed on a board different from the rotating electric machine control circuit board 700, physically spaced from the rotating electric machine control circuit board 700.

Moreover, voltage of about 12V is applied to the rotating electric machine control circuit board 700 while high voltage, such as 300V to 600V, is applied to the second discharge board 520. With physical isolation between the two boards, therefore, the second discharge board 520 can be sufficiently spaced from the rotating electric machine control circuit board 700 so that the board 520 does not affect the board 700.

Physically isolating a circuit (equivalent to a circuit on the second discharge board 520 in the present embodiment) which forcibly discharges electric charges accumulated in the first capacitor module 302 and the second capacitor module 304 from the rotating electric machine control circuit board 700 having a comparatively large area is effective for downsizing the rotating electric machine control circuit board 700. Furthermore, the second discharge board 520 can be arranged in a desired manner, for example, so that it can be positioned in a plane in parallel with or perpendicular to the rotating electric machine control circuit board 700, which is therefore very convenient for downsizing the power inverter 200.

(Each Configuration Component of Power Inverter 200)

The following explains in detail the configuration of each component shown in FIG. 2 to FIG. 4.

Chassis 210

The chassis 210, made of a metal material for example aluminum, comprises an approximately rectangular box having a coolant channel body including a coolant channel at the bottom and an opening at the top. Taking into consideration the convenience of the following explanations, one of the above-mentioned four sidewalls of the chassis 210 is referred to as front wall 232, and an adjacent sidewall to the right of the front wall 232 is referred to as main sidewall 234.

Figure 8:
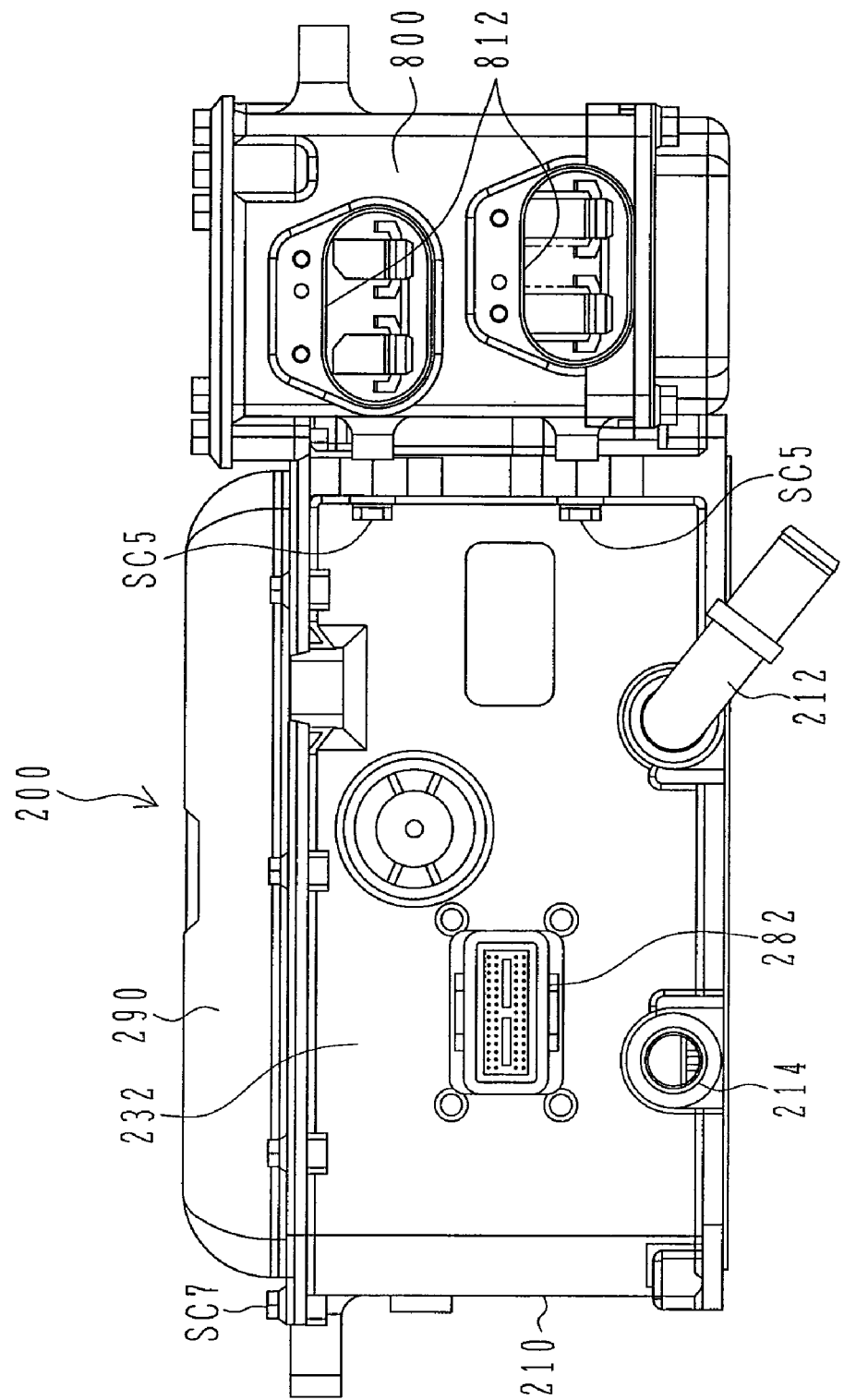
FIG. 8 is a diagram showing the power inverter connections between these circuit boards, viewed from the front wall.

FIG. 8 is a diagram showing the power inverter 200, viewed from the front wall 232 of the chassis 210.

At the bottom of the chassis 210, two coolant channels are arranged, side by side, to circle around the bottom providing a coolant channel body 220 comprising a dual structure which sandwiches a space (not shown) to which the coolant is supplied. The front wall 232 of the chassis 210 is provided with a coolant inlet pipe 212 and a coolant outlet pipe 214 connected to the above-mentioned space. The coolant can be circulated at the bottom of the chassis 210 by supplying the coolant to the above-mentioned space through the coolant inlet pipe 212 and the coolant outlet pipe 214. Specifically, the chassis 210 is provided with a coolant channel 216 at the bottom, through which the coolant circulates.

Moreover, on the upside board (the board on the side facing to the power module 500) of the coolant channel body 220 forming the above-mentioned space of this chassis 210, each of openings 218 and 219 ranging from the front wall 232 toward the opposite sidewall is formed almost at the center of each of two areas formed by a virtual center line approximately in parallel with the main sidewall 234, as shown in FIG. 4.

A pair of power modules comprising the first power module 502 and the second power module 504 are arranged at the bottom of the chassis 210. Each of the first power module 502 and the second power module 504 is positioned above the coolant channel body 220. The cooling surfaces of the first power module 502 and the second power module 504 are respectively provided with cooling fins 506 and 507 comprising a number of pin-shaped projections arranged side by side. These cooling fins 506 and 507 project into the openings 218 and 219 of the coolant channel body 220. Furthermore, the above-mentioned openings are respectively closed by the cooling surface of the power module 504 around the cooling fins 506 and 507, preventing leak and forming a sealed channel 216.

Figure 9:
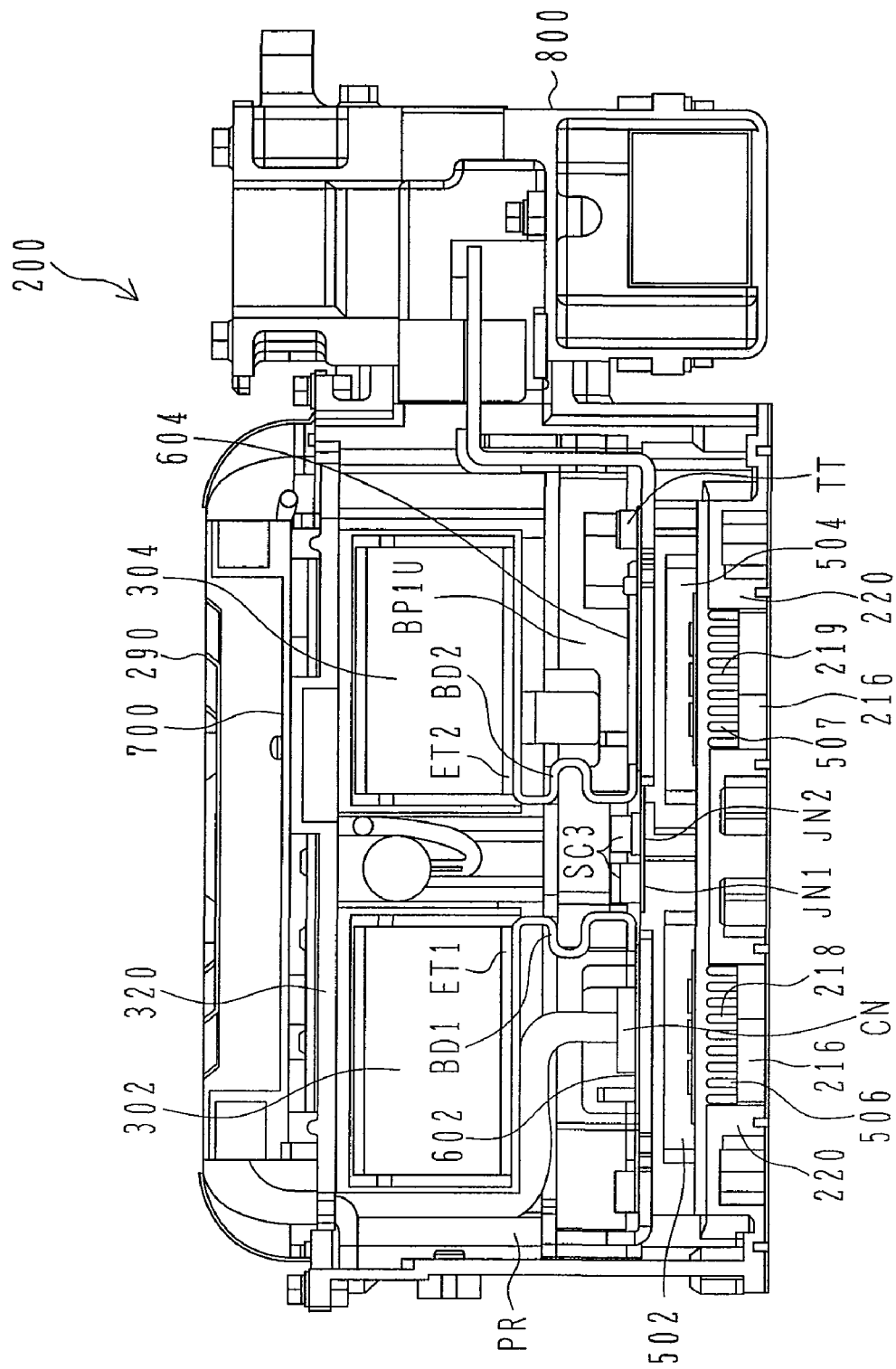
FIG. 9 is a cross-sectional view taken along the VIII-VIII line of FIG. 5.

Cooling fins RDF1 and RDF2 of the first power module 502 and the second power module 504 and the openings 218 and 219 formed at the bottom of the chassis 210 are shown in the FIG. 9 showing a section by the VIII-VIII line in FIG. 5.

With such a configuration, cooling by the coolant at the bottom of the chassis 210 is efficiently performed by cooling fins 506 and 507 of the first power module 502 and the second power module 504, respectively. Moreover, the configuration with which cooling fins 506 and 507 of the first power module 502 and the second power module 504 are inserted along with the openings 218 and 219, respectively, is effective for positioning the first power module 502 and the second power module 504 with respect to the chassis 210.

Moreover, on the front wall 232 of the chassis 210, from which the coolant inlet pipe 212 and coolant outlet pipe 214 project, an approximately square opening 260 having a comparatively small area is formed at a position above the coolant inlet pipe 212 and the coolant outlet pipe 214. The signal connector 282 later mentioned in detail will be arranged so that it projects through the opening 260 from the inside of the chassis.

Furthermore, on the main sidewall 234 of the chassis 210, as shown in FIG. 3, an opening 262 having a comparatively small area and an opening 264 having a comparatively large area ranging from the side of the front wall 232 toward the side of the opposite sidewall (facing to the front wall) are formed side by side on the opening side (upper position where a cover CV is to be attached) of the chassis 210. A terminal box 800 later mentioned in detail will be arranged on the main sidewall 234 of the chassis 210. The DC power terminal blocks 810 in the terminal box 800 are electrically connect with the first capacitor module 302 and the second capacitor module 304 in the chassis 210 through the opening 262CH2, and the AC terminal blocks 820 in the terminal box 800 are electrically connected with the first power module 502 and the second power module 504 in the chassis 210 through the opening 264.

On the inner surface of each sidewall of the chassis 210, as shown in FIG. 4, a plurality of convex parts PR are arranged side by side along the circumference. Each convex part PR ranges from the bottom of the chassis 210 toward the side of the opening end, i.e., in the height direction. The end faces of the convex parts are aligned immediately before the above-mentioned opening end. The end face of each convex part PR is almost in parallel with the coolant channel body 220 at the bottom of the chassis 210 and has a screw hole formed thereon. As later mentioned in detail, these convex parts PR support at their end faces the base plate 320 on its fringes, which is arranged so as to close the opening of the chassis 210 over a wide range. The base plate 320 is also fixed by screws SC4 (refer to FIG. 15) screwed into the above-mentioned screw holes through the base plate 320.

(Signal Connector 282)

Figure 10:
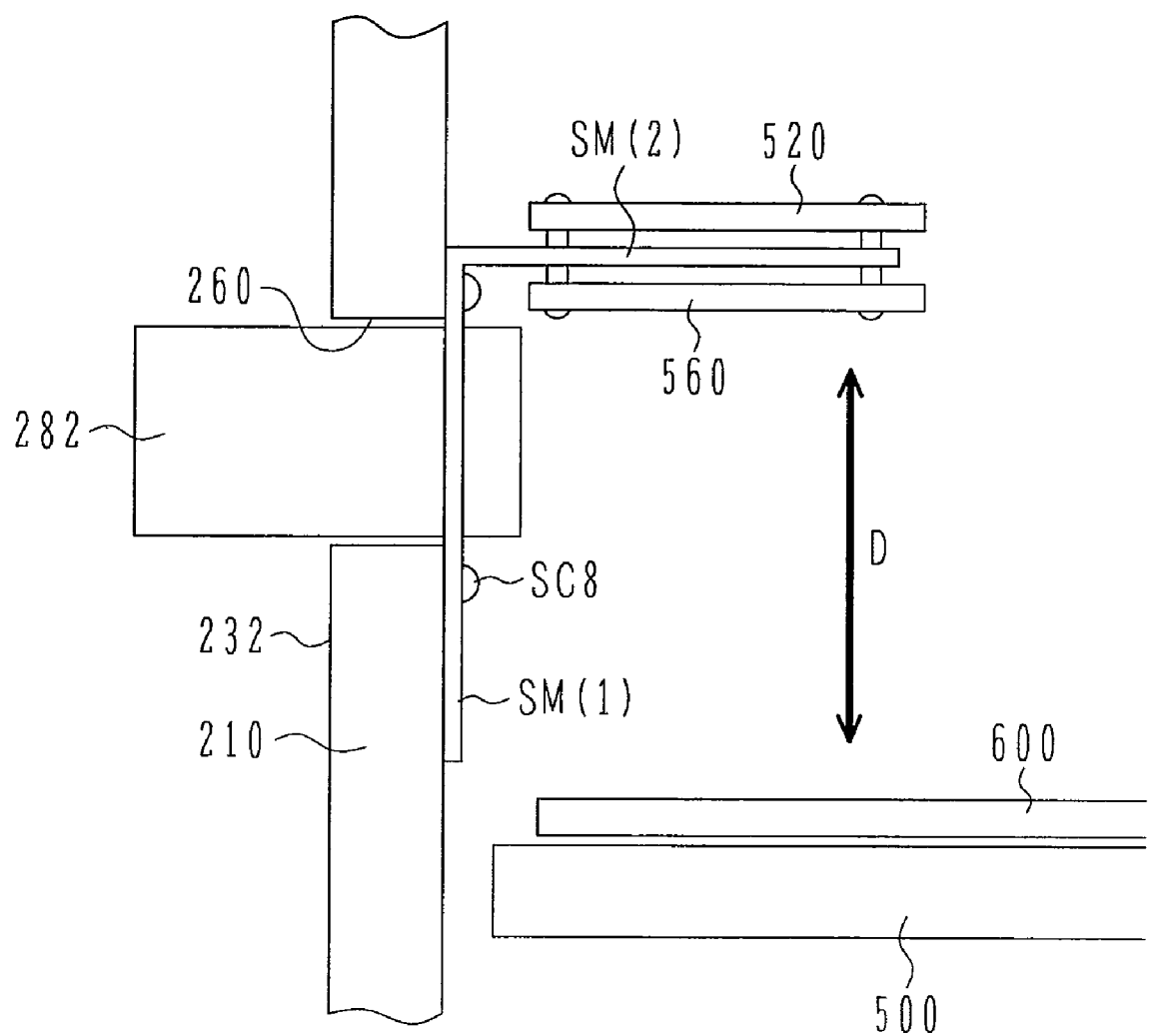
FIG. 10 is a cross-sectional view showing a signal connector to be mounted on the power inverter and a configuration thereof, according to the embodiment of the present invention.

FIG. 10 is a cross-sectional view showing the signal connector 282 and the configuration in the vicinity. The signal connector 282 is arranged at the opening 260 formed on the chassis 210, projecting from the inside to the outside of the chassis through the opening 260.

The signal connector 282 is fixed to the chassis 210 through support parts SM having an L-shaped section. Specifically, the signal connector 282 is fixed to a flat part SM (1), out of support parts SM, in parallel with the front wall 232 of the chassis 210, and the flat part SM (1) is fixed to the inner surface of the chassis 210 for example by a screw SC8, so that the signal connector be arranged in the opening 260.

The other flat part SM (2), out of the support parts SM, perpendicularly intersects with the inner surface of the chassis 210, i.e., is extended approximately in parallel with the bottom of the chassis 210. The noise reduction board 560 is mounted on the underside of the flat part and the second discharge board 520 on the upper side thereof.

Here, the second discharge board 520 is mounted on the upper surface of the flat part SM (2) of support parts SM and arranged on the near side of the opening (the side on which the cover 290 is to be attached) of the chassis 210. The second discharge board 520 is arranged as mentioned above because it is more prone to discharge breakdown than the noise reduction board 560, and this arrangement makes it easier to replace a discharge board CBD with a new one if discharge breakdown occurs.

Although not shown, the most part of wiring from the signal connector 282 is connected to the noise reduction board 560. In this case, the connector 282 and the noise reduction board 560 can be arranged in close vicinity to each other without obstacles, making it easy to arrange wiring.

Moreover, FIG. 10 shows the relationship in arrangement of the noise reduction board 560 and second discharge board 520 with respect to the power module 500 and gate drive circuit board 600 mentioned later. The noise reduction board 560 and the second discharge board 520 are arranged maintaining a sufficient distance D from the power module 500 and the gate drive circuit board 600, making it possible to reduce influences of noise from the power module 500 and the gate drive circuit board 600.

Furthermore, from the two-dimensional standpoint, the noise reduction board 560 and second discharge board 520 stacked thereon are configured so that they are stacked on a part of the power module 500 and gate drive circuit board 600. This means that the area of the chassis 210, from the two-dimensional standpoint, can be made almost equal to the area occupied by the power module 500 and gate drive circuit board 600; and that it is not necessary to take into consideration the occupied area of the noise reduction board 560 and the second discharge board 520, allowing the chassis 210 to be downsized.

(Power Module 500 and Gate Drive Circuit Board 600)

Figure 11:
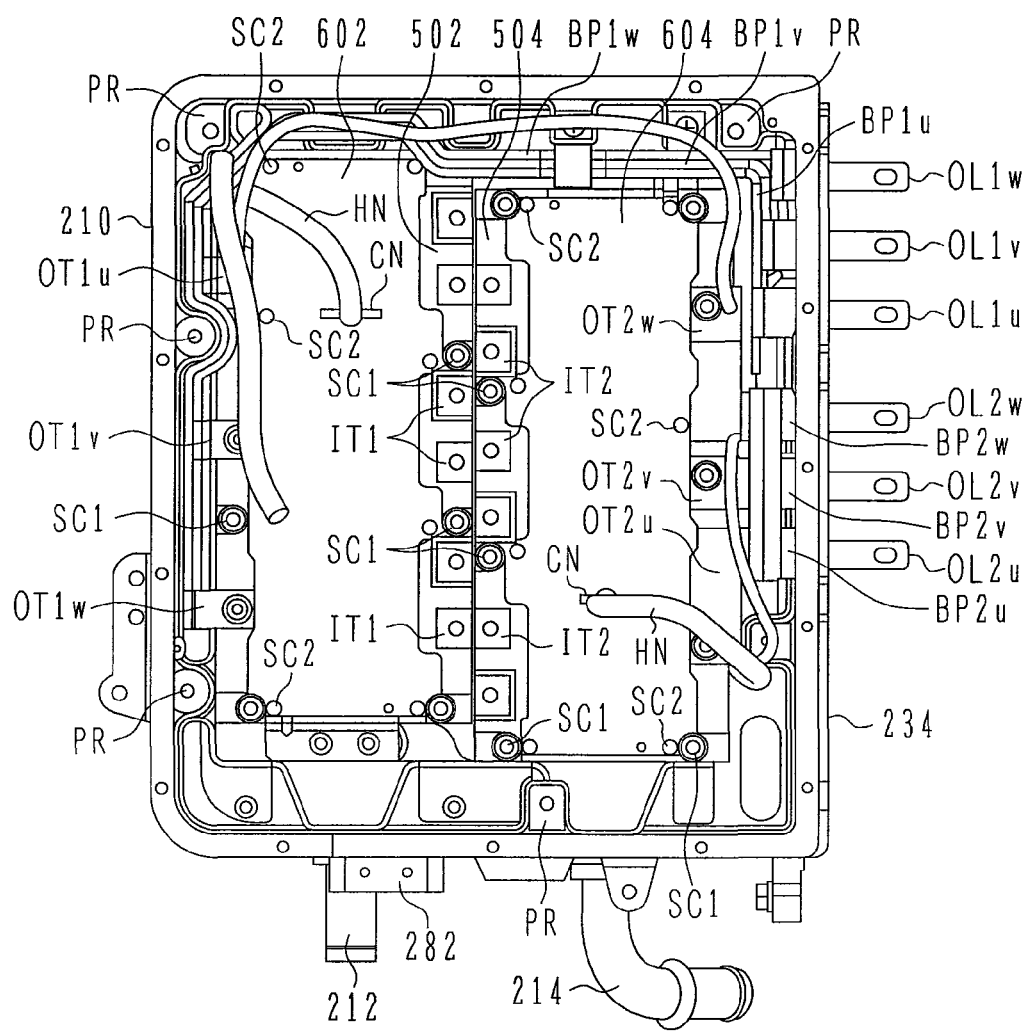
FIG. 11 is a plan view showing a condition where the power modules and the gate drive circuit boards are arranged in the chassis of the power inverter of the present invention.

FIG. 11 is a plan view showing a condition where the power module 500 and the gate drive circuit board 600 are arranged inside the chassis 210.

The first power module 502 and the second power module 504 constituting the power module 500 are arranged inside the chassis 210, and are positioned at a lower level than any other electrical components mentioned later. The first power module 502 and second power module 504 drive the first rotating electric machine 130 (motor or dynamo) and the second rotating electric machine 140 (dynamo or motor), respectively.

The first power module 502 and the second power module 504 are arranged side by side so that the short sides thereof are in parallel with the front wall 232 of the chassis 210 and the long sides thereof are in parallel with the main sidewall 234.

Moreover, each of the first power module 502 and the second power module 504 has DC input terminals IT1 and IT2 and AC output terminals OT1 and OT2 arranged in the same direction, giving the same geometrical configuration. For example, by rotating the second power module 504 by 180 degrees with respect to the first power module 502, DC input terminals IT1 and IT2 are arranged so as to face to each other. In this case, the first power module 502 and the second power module 504 are slightly shifted in the longitudinal direction to arrange the DC input terminals IT1 and IT2 so that mating terminals be arranged in the vicinity. As shown in FIG. 11, the DC input terminals IT1 and IT2 of the first power module 502 and the second power module 504 are arranged at the center of the chassis 210, and the AC output terminals OT1 and OT2 are arranged along the sides of the chassis 210.

Each of the first power module 502 and the second power module 504, although not shown, comprises an electric conductive board made of a heat conduction part for example copper; a weir-shaped case firmly attached to the fringes on the upper surface of the electric conductive board; an insulating board soldered to the area surrounded by the above-mentioned case of the above-mentioned electric conductive board; transistors (for example, insulated gate type bipolar transistors) and diodes mounted on this insulating board, and distribution layers for connecting these transistors and diodes; and a plurality of DC input terminals IT and AC output terminals OT connected with these distribution layers and formed on the above-mentioned case. It would be possible to use an IGBT instead of the above-mentioned transistor.

In FIG. 11, since the gate drive circuit boards 602 and 604 are stacked on the first power module 502 and the second power module 504, respectively, a central area where the above-mentioned transistors and diodes or IGBT are mounted is hidden; instead, the DC input terminals IT and AC output terminals OT formed on the above-mentioned case are viewed.

As mentioned above, the DC input terminals IT1 and IT2 of the first power module 502 and the second power module 504 are formed side by side along the sides facing in close vicinity to each other, and the AC output terminals OT1 and OT2 of the first power module 502 and the second power module 504 are formed side by side along the other sides in parallel with the sides on which the DC input terminals IT1 and IT2 are formed. In other words, the DC input terminals IT of the power module 500 are positioned on the inner sides of the first power module 502 and the second power module 504 arranged side by side, and the AC output terminals OT of the power module 500 are positioned on the outer sides of the first power module 502 and the second power module 504 arranged side by side.

The DC input terminals IT1 and IT2 of the first power module 502 and the second power module 504 are electrically connected with the terminals of the capacitor module 300 later mentioned in detail, and the AC output terminals OT1 and OT2 of the first power module 502 and the second power module 504 are connected to the AC terminal blocks 820 in the terminal box 800 later mentioned in detail.

Specifically, the AC output terminals OT1 of the first power module 502 include terminals OT1u, OT1v, and OT1w for the U, V, and W phases, respectively. Lead wires from the terminals OT1u, OT1v, and OT1w are lead along one short side of each of the power modules 502 and 504 arranged side by side; pass respectively through busbars BP1u, BP1v, and BP1w attached on the main sidewall 234 of the chassis 210; and are respectively lead to lead terminals OL1u, OL1v, and OL1w projecting through the opening 264 formed on the main sidewall 234 of the chassis 210.

Likewise, the AC output terminals OT2 of the second power module 504 include terminals OT2u, OT2v, and OT2w for the U, V, and W phases, respectively. Lead wires from the terminals OT2u, OT2v, and OT2w pass respectively busbars BP2u, BP2v, and BP2w attached on the main sidewall 234 of the chassis 210; and are respectively lead to lead terminals OL2u, OL2v, and OL2w projecting through the opening 264.

Cooling fins 506 and 507 projecting into the channel are prepared on the cooling surfaces of the first power module 502 and the second power module 504, respectively. Screw holes are formed around the cooling fins of the first power module 502 and the second power module 504. Each power module is fixed to the bottom of the chassis 210 through these screw holes. A gate drive circuit board 700 is arranged above a power module PUM. The gate drive circuit board 700 also comprises a pair of the first drive circuit board 602 and the second drive circuit board 604 which are different units. The first drive circuit board 602 is arranged above the power module 502 and fixed to the power module 502 with screws SC2, and the second drive circuit board 604 is arranged above the second power module 504 and fixed to the power module 504 with screws SC2.

The first drive circuit board 602 and the second drive circuit board 604 are configured as circuit boards for supplying switching signal to the first power module 502 and the second power module 504, respectively, as mentioned above.

A harness HN is lead to the first drive circuit board 602 and the second drive circuit board 604 through a connector CN prepared on the main surface. The harness HN is connected to the rotating electric machine control circuit board 700 mentioned later.

In the description of the present embodiment, although the power module 500 and the gate drive circuit board 700 are used as different units, it would be possible to integrate the gate drive circuit into the power module 500 board. The present embodiment is more desirable in terms of the cooling efficiency and downsizing of the equipment.

(Capacitor Module 300)

Figure 12:
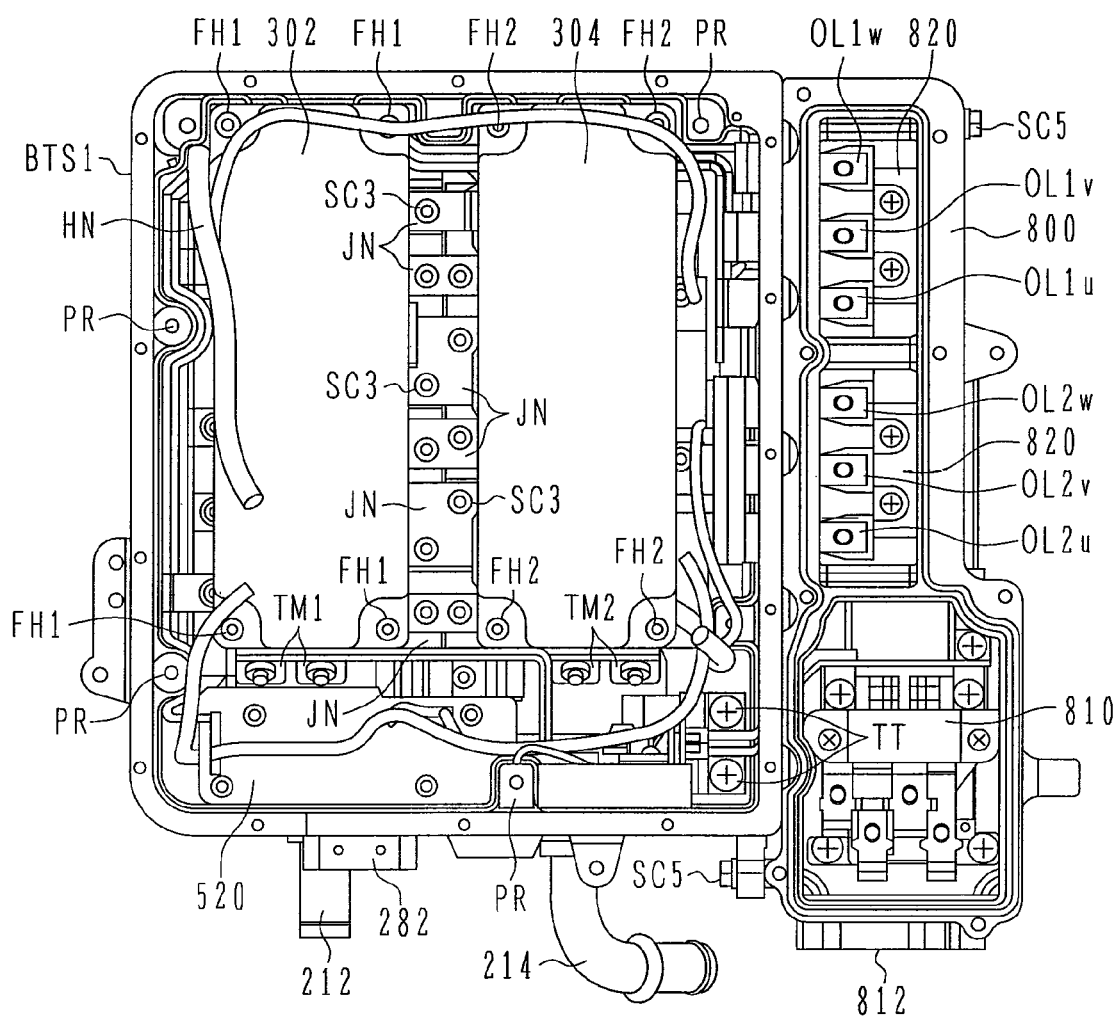
FIG. 12 is a plan view showing a condition where the capacitor modules are arranged in the chassis of the power inverter of the present invention.

FIG. 12 is a plan view showing a condition where the capacitor module 300 including a smoothing capacitor is arranged in the chassis 210.

The capacitor module 300 is arranged in the chassis 210, and is positioned above the gate drive circuit board 600.

Moreover, the capacitor module 300 comprises the first capacitor module 302 and the second capacitor module 304. Each of the first capacitor module 302 and the second capacitor module 304 includes five to six film capacitors (capacitor cells), for example, stored in a rectangular parallelepiped case made of resin material.

The first capacitor module 302 and the second capacitor module 304 are arranged side by side. The first capacitor module 302 is arranged above the first drive circuit board 602, and the second capacitor module 304 is arranged above the second drive circuit board 604.

Figure 13A:
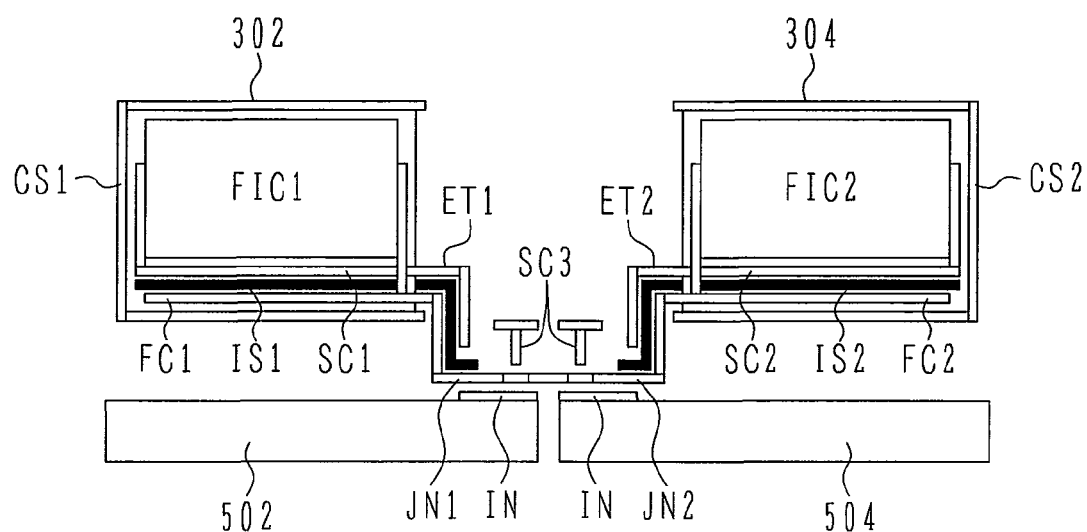
FIGS. 13A and 13B are diagrams schematically showing capacitor modules to be mounted on the power inverter according to the embodiment of the present invention, and also a cross-sectional view at a plane perpendicularly intersecting with the longitudinal direction of each capacitor module.
Figure 13B:
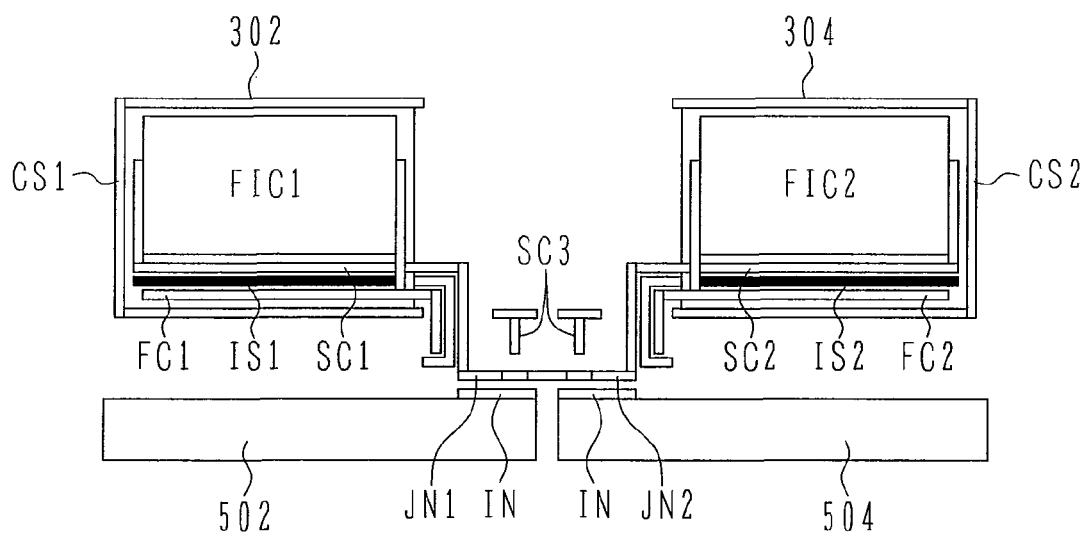

FIGS. 13A and 13B are diagrams schematically showing the first capacitor module 302 and the second capacitor module 304, and also a cross-sectional view at a plane perpendicularly intersecting with the longitudinal direction of the first capacitor module 302 and the second capacitor module 304. FIG. 13A and FIG. 13B are cross-sectional views showing cross sections of the first capacitor module 302 and the second capacitor module 304, respectively, at two different positions in the longitudinal direction.

The first capacitor module 302 and the second capacitor module 304 are slightly spaced and, for example, mutually fixed by the electrodes ET1 and ET2 arranged at the bottom so as to bridge the above-mentioned spaced section. These electrodes ET1 and ET2 are connected to the DC input terminals IN of the first power module 502 and second power module 504, respectively.

The electrode ET1, in appearance, includes a wide conductor lead from the inside outward at the bottom of the case CS1 of the first capacitor module 302 and bent toward the first power module 502 and a junction JN1 connecting the conductor to the DC input terminal IN of the first power module 502. The electrode ET1 is configured as a three-layer structure comprising a first electric conductive board FC1, an insulated sheet IS1, and a second electric conductive board SC1 in order. One electrode of a film capacitor FIC1 in the first capacitor module 302 is connected to one of the electric conductive boards FC1 and SC1, and the other electrode of the film capacitor FIC1 is connected to the other of the electric conductive boards FC1 and SC1. At the junction JN1 where the electrode ET1 is connected with the DC input terminal IN of the first power module 502, one of the electric conductive boards FC1 and SC1 is to be connected according to each of a plurality of DC input terminals IN arranged side by side. (In FIG. 13A, the electric conductive board FC1 is connected; in FIG. 13B, the electric conductive board SC1 is connected).

Likewise, the electrode ET2, in appearance, includes a wide conductor lead from the inside outward at the bottom of the case CS2 of the second capacitor module 304 and bent toward the second power module 504 and a junction JN2 connecting the conductor to the DC input terminal IN of the second power module 504. Likewise, the electrode ET2 is configured as a three-layer structure comprising a first electric conductive board FC2, an insulated sheet IS2, and a second electric conductive board SC2 in order. One electrode of a film capacitor FIC2 in the second capacitor module 304 is connected to one of the electric conductive boards FC2 and SC2, and the other electrode of the film capacitor FIC2 is connected to the other of the electric conductive boards FC2 and SC2. At the junction JN2 where the electrode ET2 is connected with the DC input terminal IN of the second power module 504, one of the electric conductive boards FC2 and SC2 is to be connected according to each of a plurality of DC input terminals IN arranged side by side.

The electrode ET1 and ET2 of the first capacitor module 302 and the second capacitor module 304 are electrically connected with the first power module 502 and the second power module 504, respectively, when the first electric conductive board FC and the second electric conductive board SC are respectively connected to a pair of DC input terminals in the so-called U-phase arm, a pair of DC input terminals in the V-phase arm, and a pair of DC input terminals in the W-phase arm in the power module 500. This is why six electrodes ET1 and ET2 (shown as symbols JN in FIG. 12) are viewed between the first capacitor module 302 and the second capacitor module 304 in FIG. 12, which correspond to a pair of DC input terminals IN on each of the three arms.

As mentioned above, the electrodes ET1 and ET2 are configured as a three-layer structure comprising the first electric conductive board FC, the insulated sheet IS, and the second electric conductive board SC in order so that the direction of current flowing in the first electric conductive board FC be opposite of that of current flowing in the second electric conductive board SC. This aims at inducing the coupling of inductance to reduce the inductance.

As shown in FIGS. 13A and 13B, the electrodes ET1 and ET2 can be configured so that they are physically connected to each other in advance at the respective junctions JN1 and JN2 at which they are connected with the DC input terminals IN of the second power module 504. Alternatively, unlike FIGS. 13A and 13B, the electrodes can also be configured so that they are initially disconnected and then physically (electrically) connected when they are connected to the DC input terminals IN of the power module 500.

The junctions JN at which the electrodes ET1 and ET2 are connected with the DC input terminals IN of the power module 500 are fixed to the DC input terminals IN of the power module 500 by screws SC3 screwed into the DC input terminals IN through the junctions JN, thus realizing reliable electrical connections.

The first capacitor module 302, the second capacitor module 304, the first power module 502, and the second power module 504 schematically shown in FIGS. 13A and 13B respectively correspond to the first capacitor module 302, the second capacitor module 304, the first power module 502, and the second power module 504 shown in FIG. 9. In this case, the first capacitor module 302 and the second capacitor module 304 shown in FIG. 9 respectively include curved bending structures BD1 and BD2 in the halfway of the electrodes ET1 and ET2. The bending structures BD1 and BD2 of the electrodes ET1 and ET2 can absorb and reduce stress in electrodes ET1 and ET2.

As shown in FIG. 12, the first capacitor module 302 includes a pair of electrodes TM1 connected to the battery 180 through the DC power terminal blocks 810 mentioned later. Likewise, the second capacitor module 304 includes a pair of electrodes TM2 connected to the battery 180 through the DC power terminal blocks 810 mentioned later.

Each electrode TM1 of the first capacitor module 302 is connected to the first electric conductive board FC1 on one side and the second electric conductive board SC1 on the other side. Each electrode TM2 of the second capacitor module 304 is connected to the first electric conductive board FC2 on one side and the second electric conductive board SC2 on the other side.

The electrodes TM1 and TM2 of the first capacitor module 302 and the second capacitor module 304 are respectively arranged on the side of the front wall 232 of the chassis 210. The electrodes TM1 and TM2 are thus arranged on the side of the front wall 232 of the chassis 210 because the DC power terminal blocks 810 arranged in the terminal box 800 later mentioned in detail are positioned on the side of the front wall 232 of the chassis 210.

Electrical connection between each electrode TM1 of the first capacitor module 302 and the DC power terminal blocks 810 is established through busbars BB1. Electrical connection between each electrode TM2 of the capacitor module CT2 and the DC power terminal blocks 810 is established through busbars BB2 (refer to FIG. 3).

As shown in FIG. 3, for example, the first capacitor module 302 and the second capacitor module 304 have a slight gap therebetween, and the first discharge resistor (not shown) and the second discharge resistor 524 are arranged side by side in this gap along the axial direction. As shown in FIG. 12, the gap between the first capacitor module 302 and the second capacitor module 304 is necessary to electrically connect the first capacitor module 302 and the second capacitor module 304 with the first power module 502 and the second power module 504, respectively, using the screws SC3 at the junctions JN of the electrodes ET1 and ET2 of the first capacitor module 302 and the second capacitor module 304. Upon completion of these connections, the gap is effectively used through arrangements of the above-mentioned first discharge resistor (not shown) and second discharge resistor 524.

Furthermore, the first capacitor module 302 of and second capacitor module 304 are fixed to the base plate 320 mentioned later. Specifically, as shown in FIG. 12, the first capacitor module 302 and the second capacitor module 304 have respective four fixing holes FH1 and FH2 with embedded nuts at respective four corners. The first capacitor module 302 and the second capacitor module 304 are fixed to the base plate 320 by screws SC4 (refer to FIG. 15) screwed into the fixing holes FH1 and FH2 through holes corresponding to the fixing holes FH1 and FH2 of the base plate 320. Specifically, the first capacitor module 302 and the second capacitor module 304 are fixed to the base plate 320 in a suspended condition.

(Terminal Box 800)

The terminal box 800 is fixed to the chassis 210 of the power inverter 200, and the DC power terminal blocks 810 and the AC terminal blocks 820 are arranged therein.

Figure 14:
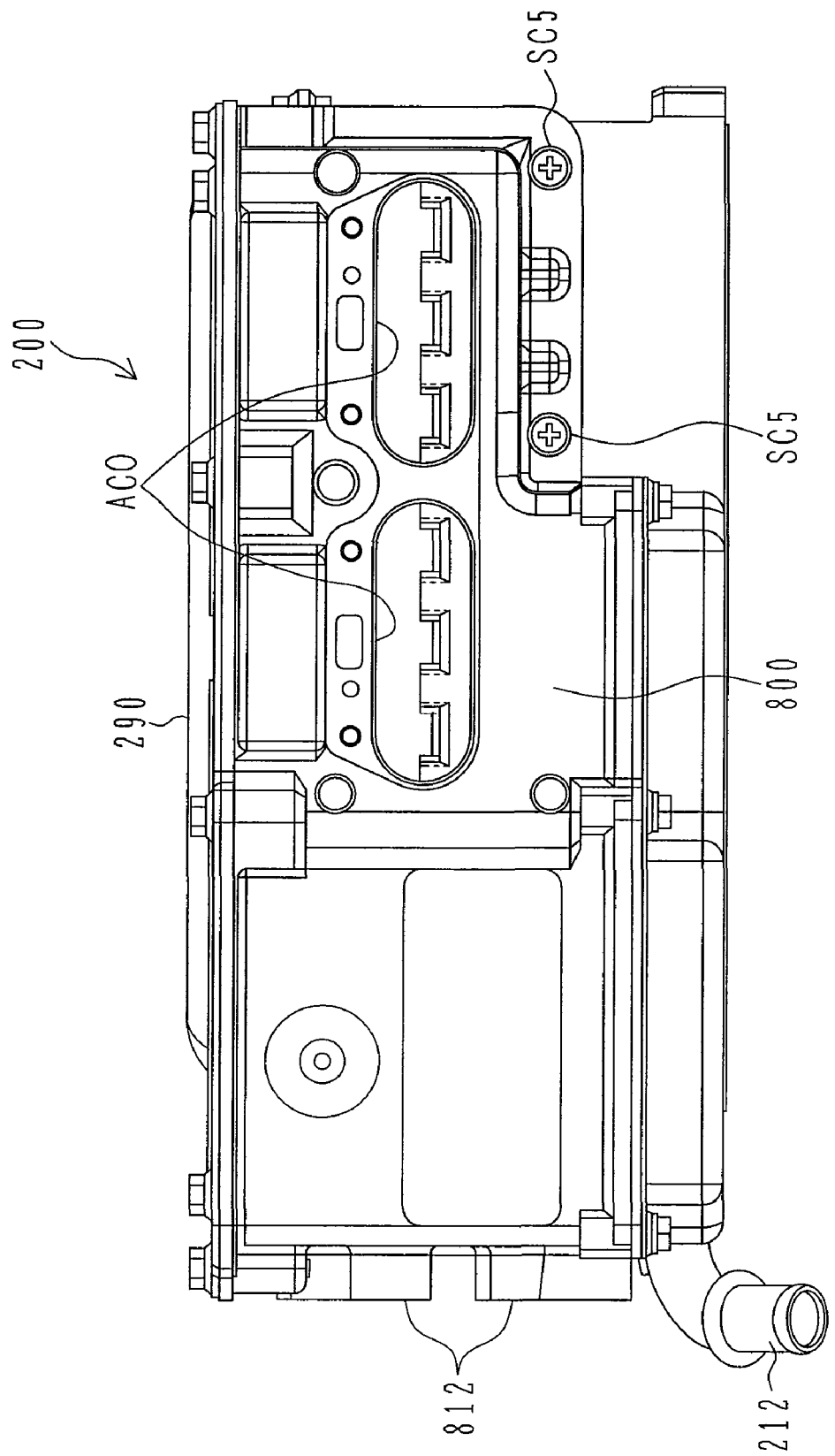
FIG. 14 is a side elevation view showing the power inverter according to the embodiment of the present invention, viewed from the terminal box attachment side.

The appearance of the power inverter 200, viewed from the side on which the terminal box 800 is attached is shown in FIG. 14. The terminal box 800 is attached to the main sidewall 234 of the chassis 210 using a plurality of screws SC5.

As shown in FIG. 2 to FIG. 4, a comparatively small opening 266 and a comparatively large opening 268 are formed on the terminal box 800 respectively corresponding to the comparatively small opening 262 and the comparatively large opening 264 formed on the main sidewall 234 of the chassis 210. The terminal box 800 is provided with a partition 852 which bisects the openings 266 and 268. The DC power terminal blocks 810 are arranged at a space near the opening 266 and the AC terminal blocks 820 are arranged at a space near the opening 268.

The DC power terminal blocks 810 include a noise filter which removes noise from the DC power supplied from the battery 180 through the DC power terminals 812. The noise filter prevents noise occurring in switching operation of the power module 500 from leaking to outside.

From the DC power terminal blocks 810 extends a conductive material having a rectangular cross section through the openings 266 and 262 to electrically connect with a pair of terminals TT inside the chassis 210 arranged in the vicinity of the DC power terminal blocks 810. The terminals TT are connected with the electrodes TM1 and TM2 of the first capacitor module 302 and the second capacitor module 304 through the busbars BB1 and BB2, respectively, and then electrically connected with the DC input terminals of the power module 500.

The AC terminal blocks 820 are connected with the lead terminals OL1 and OL2 inserted through the opening 264 of the chassis 210 and the opening 268 of the terminal box 800. The lead terminals OL1 are connected with the AC output terminals OT1 of the first power module 502 through busbars BP1, and the lead terminals OL2 are connected with the AC output terminals OT2 of the second power module 504 through busbars BP2.

The configuration of the terminal box 800 is such that the lead terminals OL1 include lead terminals OL1w, OL1v, and OL1u which are respectively connected to the W-phase connection terminal, V-phase connection terminal, and U-phase connection terminal of the first rotating electric machine 130 through the AC power junction 822 prepared in the terminal box 800. Likewise, the configuration of the terminal box 800 is such that the lead terminals OL2 include lead terminals OL2w, OL2v, and OL2u which are respectively connected to the W-phase connection terminal, V-phase connection terminal, and U-phase connection terminal of the second rotating electric machine 140 through the AC power junction 822 prepared in the terminal box 800. The AC terminal blocks 820, including current sensors 536 and 538 for detecting alternating current, detect current flowing in each phase of the first rotating electric machine 130 and the second rotating electric machine 140.

The terminal box 800 is provided with the terminal box cover 846 on the upper face and the bottom 844 mounting the DC power terminal blocks 810 on the bottom face. The present embodiment is provided with a terminal box 800 through which the power inverter is connected with an external DC power supply and each external rotating electric machine. Therefore, even if the position of each rotating electric machine or DC power supply differs from model to model, this structure is effective for application without modifying the structure of the main unit or through slight modifications.

(Base Plate 320)

FIG. 14 is a plan view showing a condition where the base plate 320 is arranged inside the chassis 210. It also shows the rotating electric machine control circuit board 700 mounted on the base plate 320.

The base plate 320 is configured as a control board bracket including the rotating electric machine control circuit board 700, and is fixed to the chassis 210 at a position above the capacitor module 300 inside the chassis 210.

Specifically, a plurality of convex parts PR are formed at almost equal intervals along the same direction on the inner surfaces of the chassis 210, allowing the base plate 320 to be supported on its fringes by the upper faces of the convex parts PR and arranged to a fixed position by screws SC4 screwed into the upper faces of the convex parts PR through the holes formed on the fringes of the base plate 320.

Like the chassis 210, the base plate 320 is made of a metal material with a favorable heat conductivity, for example, aluminum material in order to improve the mechanical strength.

Moreover, a concavo-convex pattern is formed on the surface on which the rotating electric machine control circuit board 700 is mounted.

The above-mentioned concave of the base plate 320 is formed at a portion facing to the distribution layer formation area on the base-plate side of the rotating electric machine control circuit board 700, preventing the distribution layer from coming into contact with the base plate 320 made of metal material and thus preventing electrical short-circuit in the distribution layer.

The convex of the base plate 320 is formed at a portion facing to the second block BST2 of the rotating electric machine control circuit board 700, the comparatively large heat-generating semiconductors being mounted on the opposite side thereof, making it easier to transfer heat from the semiconductors, etc. to the side of the second block. In this case, it would be also possible to insert a sheet made of an insulation material with a favorable heat conductivity between the convex and the rotating electric machine control circuit board 700 to prevent electrical short-circuit by the base plate 320 occurring in the distribution layer formed on the opposite side of the semiconductor mount area with respect to the rotating electric machine control circuit board 700.

As shown in FIG. 3, a plurality of scattering bossed sections BS are formed on the surface of the base plate 320 facing to the rotating electric machine control circuit board 700, for example, in the above-mentioned concave. The rotating electric machine control circuit board 700 is fixed to the base plate 320 at these bossed sections by screws SC6 (refer to FIG. 15) screwed through the screw holes formed on the rotating electric machine control circuit board 700.

As mentioned above, the base plate 320 fixes the first capacitor module 302 and second capacitor module 304 arranged below them by screws SC4 screwed into the fixing holes FH1 and FH2 formed on four corners of the first capacitor module 302 and second capacitor module 304 through the screw holes formed on the base plate 320.

Since the first capacitor module 302 and the second capacitor module 304 are fixed to the base plate 320 arranged in contact with the chassis 210, the heat generated in the first capacitor module 302 and the second capacitor module 304 is easily transferred to the chassis 210 through the base plate 320, offering excellent cooling effects.

(Rotating Electric Machinery Control Circuit Board 700)

Figure 15:
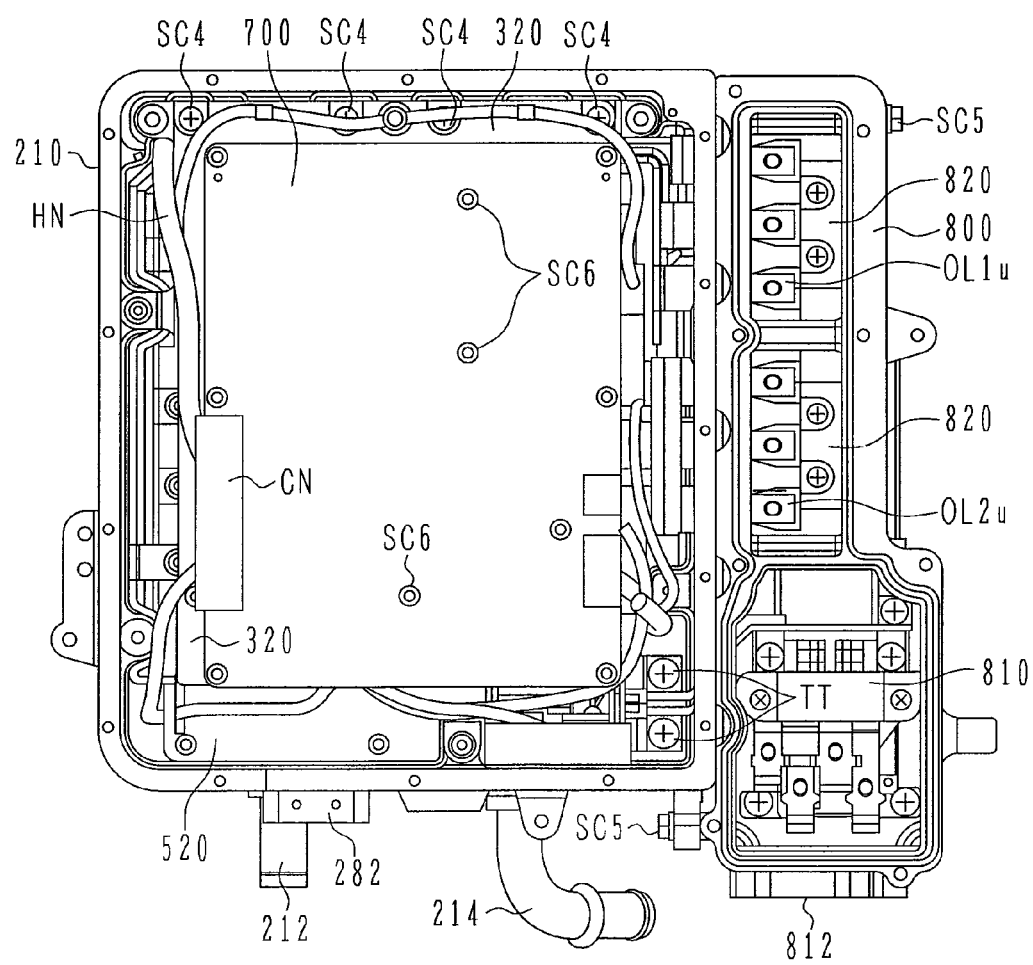
FIG. 15 is a plan view showing a condition where the second block is arranged in the chassis of the power inverter of the present invention, as well as the rotating electric machine control circuit board mounted on the second block B.

FIG. 15 is a plan view showing the rotating electric machine control circuit board 700 mounted on the base plate 320 in the chassis 210.

The rotating electric machine control circuit board 700 mounts small-signal electronic components together with the connector CN. The connector CN is connected to a connector CN mounted on the gate drive circuit board 6001 through the harness HN.

The rotating electric machine control circuit board 700 is fixed to the base plate 320 by screws SC6 screwed into the base plate 320 through screws holes formed on, for example, four corners, fringes, and inner areas excluding the fringes, avoiding parts mount areas and distribution layer formation area for connection of these parts.

With the above arrangement, the rotating electric machine control circuit board 700 makes it easier to prevent the central area from bending by vibration, etc., than a structure fixed to the frame only on fringes thereof, for example.

As mentioned above, since the rotating electric machine control circuit board 700 is mounted on the base plate arranged in contact with the chassis 210, the heat generated from the rotating electric machine control circuit board 700 is easily transferred to the chassis 210 through the base plate 320, offering excellent cooling effects.

Cover 290

The cover 290 is made of a lid material which closes the opening of the chassis 210 after storing the first power module 502 and second power module 504, gate drive circuit boards 6001 and 6002, first capacitor module 302 and second capacitor module 304, base plate 320, and rotating electric machine control circuit board 700 in order in the chassis 210.

The cover 290 is made of, for example, the same material as the chassis 210 and fixed to the chassis 210 by screws SC7 screwed into the upper face of the chassis 210 through screw holes formed side by side at equal intervals along the circumference on the fringes thereof (refer to FIG. 5).

(Assembly Procedures of Power Inverter 200)

The following explains assembly procedures of the power inverter 200 with reference to FIG. 2 to FIG. 4.

Step 1: A power module assembly unit comprising the first power module 502, the second power module 504, the first drive circuit board 602, and the second drive circuit board 604 is attached to the chassis 210 including the coolant inlet pipe 212 and the coolant outlet pipe 214. At this time, the cooling fins 506 and 507 of the power module assembly unit are inserted into the openings 218 and 219 of the channel 216 prepared at the bottom which is one side of the chassis 210, and then the openings 218 and 219 of the channel 216 are sealed. Moreover, the busbars for electrically connecting the first power module 502 and the second power module 504 with the rotating electric machines 130 and 140 are fixed. When cooling fins 506 and 507 are inserted in the openings 218 and 219, positioning can be performed around the openings, improving the workability of attachment work of the assembly unit.

Step 2: The signal connector 282, the noise reduction board 560, and the second discharge board 520 are attached to the power module assembly unit. It would be also possible to attach the power module assembly unit 580 to the chassis 210 after attaching the signal connector 282, the noise reduction board 560, and the second discharge board 520 to the power module assembly unit.

Step 3: The capacitor module 300 including a plurality of capacitor modules 302 and 304 is inserted above the power module assembly unit 580 and then wiring is performed.

Step 4: The base plate 320 is attached to a sidewall of the chassis 210 so that the base plate 320 be positioned above the capacitor module 300. The capacitor module 300 is fixed to the base plate 320 in this step. The workability of electrical connection between the capacitor module 300 and the power module is improved by first making electrical connection between the capacitor module 300 and the power module assembly unit and then attaching the base plate 320 to be located above them. However, it would be possible to first fix the capacitor module 300 to the base plate 320 and then attach the base plate 320 with the capacitor module 300 fixed thereto above the power module assembly unit 580. In this case, since wiring work will be performed after attachment of the base plate 320, the workability is improved by making work holes on some portions of the base plate 320 and the inner walls of the chassis 210.

Step 5: The rotating electric machine control circuit board 700 is fixed to the base plate 320 and then wiring connection is made. However, it would be possible to first fix the rotating electric machine control circuit board 700 to the base plate 320 and then fix the base plate 320 to a sidewall of the chassis 210. The workability is improved and the reliability of wiring connection ensured by fixing the rotating electric machine control circuit board 700 to the base plate 320 before fixing the base plate 320 to the chassis 210.

Step 6: The cover 290 is attached.

Step 7: The AC terminal blocks 820 is attached to the chassis 210, and the terminal box 800 including the DC power terminal blocks 810 is attached to the chassis 210. The bottom plate 844 is attached to the main unit 840 of the terminal box 800 to make electrical connection, and the cover 846 is attached to the main unit 840. It would be possible to attach the cover 290 after completion of attachment of the terminal box 800 to the chassis 210. Moreover, it would be possible to attach the capacitor module 300 and the base plate 320 after completion of attachment of the terminal box 800 to the chassis 210.

(An Arrangement Aspect of Power Inverters 200 in Engine Room)

With the thus-configured power inverter 200, the front wall 232 of the chassis 210 is provided with the signal connector 282, and the coolant inlet pipe 212 and the coolant outlet pipe 214 for coolant circulation; the main sidewall 234 perpendicularly intersecting with front wall 232 is provided with the terminal box 800 including the DC power terminal blocks 810 and the AC terminal blocks 820.

This allows other devices physically or electrically connected with the power inverter 200 to be arranged collectively, for example, on the front side or on the side of one of both side faces of the power inverter 200. This allows other devices to be arranged also on the wall side of the space for arranging the power inverter 200, which is effective for improving the flexibility of arrangement of the power inverter 200.

Figure 16:
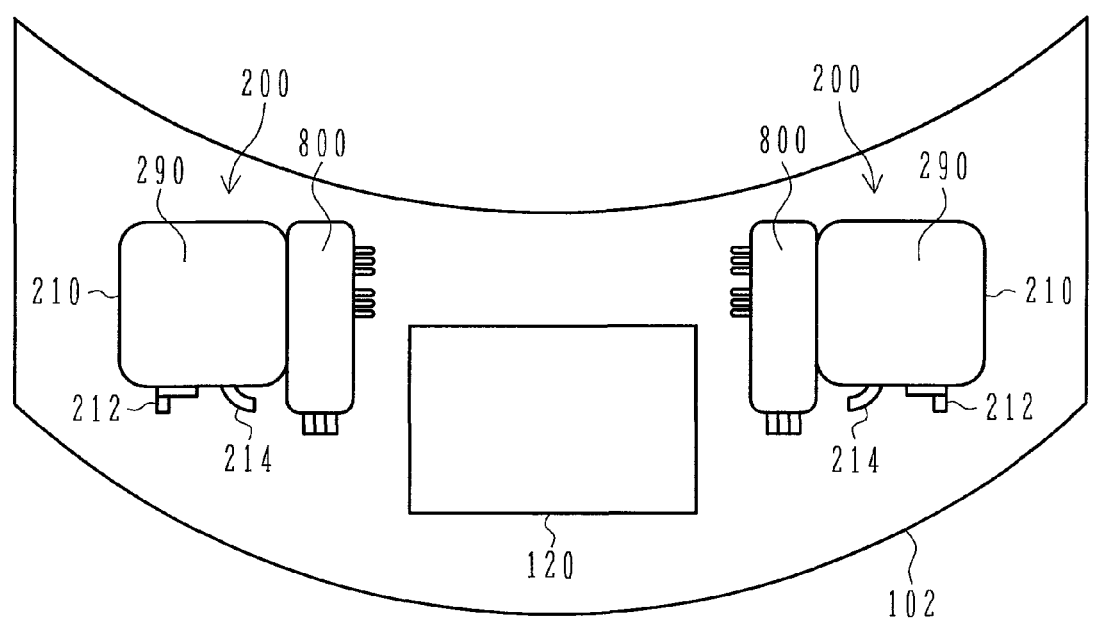
FIG. 16 is a diagram showing an arrangement aspect of the power inverter of the present invention in the vehicle engine room.

FIG. 16 is a plan view showing an embodiment of arrangement aspect of two power inverters 200 in an engine room 102 in which an engine 120 is arranged at the center.

One power inverter 200 is placed on the left-hand side of the engine 120 and on the back side of the engine room 102, and the other power inverter 200 is placed on the right-hand side of this engine 120 and on the back side of the engine room 102.

In this case, when the front wall 232 of the chassis 210 of each power inverter 200 is arranged in advance, the main sidewalls 234 of the power inverters are respectively positioned in opposite directions.

With each power inverter 200, therefore, the signal connector 282, and the coolant inlet pipe 212 and coolant outlet pipe 214CLO for coolant circulation are oriented on the front side; and the terminal box 800 is oriented on the side of the engine 120.

As shown in FIG. 16, it is possible to arrange the two power inverters 200 on the back side of the engine room, sandwiching the engine 120, allowing physical and electrical connections with other devices to be performed easily.

The power inverter by the present invention is applied to, for example, a hybrid vehicle. The power inverter is not limited to this, but can be applied to any kinds of power inverters that utilize at least a rotating electric machine and require an inverter to control it.

Each of the embodiments can be used either independently or in combination with other ones because effects in each embodiment can be obtained independently or in a synergetic manner.

What is claimed is:

1. A power inverter comprising:
   a power module for converting direct-current to alternative current;
   a gate drive circuit board for supplying switching power to said power module;

a rotating electric machine control circuit board for supplying a signal for controlling an electric rotating machine to said gate drive circuit board;

a smoothing capacitor module connected in parallel electrically to said power module and at the side of a battery of said power module;

a housing for storing said power module, said gate drive circuit board, said rotating electric machine control circuit board and said smoothing capacitor module; and an active discharge circuit formed on a board different from said rotating electric machine control circuit board for discharging charge stored in said smoothing capacitor module, wherein said power module is arranged at one side of a storage area of said housing;

said smoothing capacitor module is arranged at another side of the storage area of said housing; and said active discharge circuit is arranged rather than said power module at a side nearer said smoothing capacitor module.

2. A power inverter according to claim 1, further comprising:

a coolant channel body for being fixed to said housing and forming a channel for flowing cooling water, wherein said power module is fixed at a side where said rotating electric machine control circuit board is arranged to said coolant channel body.

3. A power inverter according to claim 2, further comprising:

a base plate for being fixed to said housing for holding said rotating electric machine control circuit board, wherein said rotating electric machine control circuit board is fixed at a side opposite a side where said power module is arranged to said base plate.

4. A power inverter according to claim 3, wherein said capacitor module comprises:

a capacitor module case;

a laminated conductor for projecting and extending from inside said capacitor module case; and a film capacitor connectable to a portion of said laminated conductor positioned inside said capacitor module, wherein direct electric power is supplied via a portion of said laminated conductor positioned outside said capacitor module.

5. A power inverter according to claim 2, wherein said capacitor module comprises:

a capacitor module case;

a laminated conductor for projecting and extending from the inside of said capacitor module case; and a film capacitor for being connected to the inside portion of said laminated conductor which is positioned inside of said capacitor module, wherein direct electric power is supplied via a portion of said laminated conductor positioned outside of said capacitor module.

6. A power inverter according to claim 2, wherein an opening connecting to the channel is formed at said coolant channel body;

said power module includes a heat dissipation side, and a heat dissipation fin is provided at the heat dissipation side; and said heat dissipation fin projects through said opening into the passage, with said opening being sealed by said heat dissipation side.

7. A power inverter according to claim 1, wherein said gate drive circuit board is arranged between said power module and said smoothing capacitor module.

8. A power inverter according to claim 7, wherein said capacitor module comprises:

a capacitor module case;

a laminated conductor for projecting and extending from inside said capacitor module case; and a film capacitor connectable to a portion of said laminated conductor positioned inside said capacitor module, wherein direct electric power is supplied via a portion of said laminated conductor positioned outside said capacitor module.

9. A power inverter according to claim 1, wherein said capacitor module comprises:

a capacitor module case;

a laminated conductor for projecting and extending from the inside of said capacitor module case; and a film capacitor for being connected to the inside portion of said laminated conductor which is positioned inside of said capacitor module, wherein direct electric power is supplied via the outside portion of said laminated conductor which is positioned outside of said capacitor module.

10. A power inverter according to claim 9, wherein said power module and said capacitor module are arranged so that said power module is oppposingly spaced from said capacitor module;

the portion of said laminated conductor inside said capacitor module case is arranged in the state of countering said power module extended along the filed of said power module; and the portion of said laminated conductor outside said capacitor module case extends to a direction approaching said power module.

11. A power inverter according to claim 1, wherein a terminal box is provided exteriorally of said housing; and said terminal box includes an AC terminal block for supplying AC electric power generated inside of said housing to said electric rotating machine.

12. A power inverter according to claim 1, wherein a terminal box is provided exteriorally of said housing; and said terminal box includes an DC terminal block for receiving DC electric power and supplying the DC electric power to said capacitor module in said housing, and a noise filter between said DC terminal block and said capacitor module.

\* \* \* \* \*